United States Patent
Reber et al.

(10) Patent No.: US 9,515,006 B2
(45) Date of Patent: *Dec. 6, 2016

(54) 3D DEVICE PACKAGING USING THROUGH-SUBSTRATE POSTS

(71) Applicant: Freescale Semiconductor, Inc., Austin, TX (US)

(72) Inventors: Douglas M. Reber, Austin, TX (US); Mehul D. Shroff, Austin, TX (US); Edward O. Travis, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/303,128

(22) Filed: Jun. 12, 2014

(65) Prior Publication Data

US 2015/0091187 A1   Apr. 2, 2015

Related U.S. Application Data

(63) Continuation-in-part of application No. 14/169,254, filed on Jan. 31, 2014, which is a continuation-in-part of application No. 14/039,622, filed on Sep. 27, 2013.

(51) Int. Cl.
*H01L 23/48* (2006.01)
*H01L 23/52* (2006.01)
(Continued)

(52) U.S. Cl.
CPC ........... *H01L 23/481* (2013.01); *H01L 21/561* (2013.01); *H01L 21/76898* (2013.01); *H01L 23/3114* (2013.01); *H01L 23/3185* (2013.01); *H01L 24/16* (2013.01); *H01L 24/24* (2013.01); *H01L 24/81* (2013.01); *H01L 24/82* (2013.01); *H01L 25/0657* (2013.01);
(Continued)

(58) Field of Classification Search
USPC ........ 257/E33.066, 686, 690, 737, 777, 778, 257/782, E33.056, E33.058, 433, 257/E25.031–E25.032, 772, 779, 678–733, 257/787–796, E23.001–E23.194, 257/E21.499–E21.519, 100, 434, 667, 257/E31.117–E31.118, E51.02; 438/6, 28, 438/66, 67, 107, 109, 406, 455–458, 396, 438/124, 15, 613, 614, 652
See application file for complete search history.

(56) References Cited

U.S. PATENT DOCUMENTS 5,218,234 A   6/1993   Thompson et al.
5,766,982 A   6/1998   Akram et al.
(Continued)

OTHER PUBLICATIONS

A.C. Fischer et al., "Low-Cost Through Silicon Vias (TSVs) With Wire-Bonded Metal Cores and Low Capacitive Substrate-Coupling", Micro Electro Mechanical Systems (MEMS), IEEE 23rd International Conference, Jan. 24, 2010, 4 pages.
(Continued)

*Primary Examiner* — Tram H Nguyen

(57) ABSTRACT

A method for 3D device packaging utilizes through-hole metal post techniques to mechanically and electrically bond two or more dice. The first die includes a set of through-holes extending from a first surface of the first die to a second surface of the first die. The second die includes a third surface and a set of metal posts. The first die and the second die are stacked such that the third surface of the second die faces the second surface of the first die, and each metal post extends through a corresponding through-hole to a point beyond the first surface of the first die, electrically coupling the first die and the second die.

20 Claims, 14 Drawing Sheets

(51) Int. Cl.
*H01L 29/40* (2006.01)
*H01L 25/065* (2006.01)
*H01L 25/00* (2006.01)
*H01L 21/768* (2006.01)
*H01L 23/31* (2006.01)
*H01L 21/56* (2006.01)
*H01L 23/00* (2006.01)

(52) U.S. Cl.
CPC ............ *H01L 25/50* (2013.01); *H01L 24/13* (2013.01); *H01L 2224/04042* (2013.01); *H01L 2224/04073* (2013.01); *H01L 2224/056* (2013.01); *H01L 2224/05571* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/05684* (2013.01); *H01L 2224/1134* (2013.01); *H01L 2224/13023* (2013.01); *H01L 2224/13082* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/13169* (2013.01); *H01L 2224/14131* (2013.01); *H01L 2224/14517* (2013.01); *H01L 2224/16111* (2013.01); *H01L 2224/16145* (2013.01); *H01L 2224/16146* (2013.01); *H01L 2224/16147* (2013.01); *H01L 2224/16238* (2013.01); *H01L 2224/17181* (2013.01); *H01L 2224/24145* (2013.01); *H01L 2224/81141* (2013.01); *H01L 2224/81191* (2013.01); *H01L 2224/81192* (2013.01); *H01L 2224/81815* (2013.01); *H01L 2224/81897* (2013.01); *H01L 2224/81906* (2013.01); *H01L 2224/81951* (2013.01); *H01L 2224/82101* (2013.01); *H01L 2224/82138* (2013.01); *H01L 2224/94* (2013.01); *H01L 2225/06513* (2013.01); *H01L 2225/06541* (2013.01); *H01L 2225/06593* (2013.01); *H01L 2924/12042* (2013.01); *H01L 2924/15788* (2013.01)

(56) References Cited

U.S. PATENT DOCUMENTS

| | | | |
|---|---|---|---|
| 5,973,396 | A | 10/1999 | Farnworth |
| 5,998,292 | A | 12/1999 | Black et al. |
| 6,038,136 | A | 3/2000 | Weber |
| 6,168,972 | B1 | 1/2001 | Wang et al. |
| 6,207,475 | B1 | 3/2001 | Lin et al. |
| 6,245,595 | B1 | 6/2001 | Nguyen et al. |
| 6,297,548 | B1 * | 10/2001 | Moden ............... H01L 23/13 257/686 |
| 6,400,008 | B1 * | 6/2002 | Farnworth ............ H01L 23/481 257/621 |
| 6,774,497 | B1 | 8/2004 | Qi et al. |
| 6,872,594 | B2 * | 3/2005 | Gebauer ........... H01L 21/76898 257/E21.597 |
| 7,579,215 | B2 | 8/2009 | Swirbel |
| 7,982,298 | B1 * | 7/2011 | Kang ................. H01L 25/03 257/621 |
| 8,021,930 | B2 | 9/2011 | Pagaila |
| 8,030,770 | B1 | 10/2011 | Juskey et al. |
| 8,294,279 | B2 | 10/2012 | Chen et al. |
| 2003/0151139 | A1 * | 8/2003 | Kimura ............ H01L 23/49827 257/737 |
| 2006/0281223 | A1 | 12/2006 | Liu et al. |
| 2009/0057918 | A1 * | 3/2009 | Kim ................. H01L 25/0657 257/777 |
| 2010/0102444 | A1 * | 4/2010 | Khor ................. H01L 21/561 257/737 |
| 2011/0068427 | A1 * | 3/2011 | Paek ................. H01L 24/19 257/433 |
| 2011/0316123 | A1 * | 12/2011 | Sasaki ............. H01L 25/0657 257/620 |
| 2012/0012990 | A1 * | 1/2012 | Pagaila ............. H01L 23/5389 257/659 |
| 2012/0199981 | A1 * | 8/2012 | Jeong ............... H01L 23/481 257/774 |
| 2013/0012015 | A1 | 1/2013 | Oh et al. |
| 2013/0032925 | A1 * | 2/2013 | Kitano .............. H01L 23/5225 257/532 |
| 2013/0062757 | A1 | 3/2013 | Feger et al. |
| 2013/0119549 | A1 * | 5/2013 | Cheng et al. ........... 257/772 |
| 2013/0161795 | A1 * | 6/2013 | Owada .............. H01L 21/6835 257/620 |
| 2014/0284785 | A1 * | 9/2014 | Sung ................ H01L 25/0657 257/692 |

OTHER PUBLICATIONS

Gilles Poupon et al., "From the Single Chip to the Wafer Integration", CEA-LETI Minatec, Gernoble, France, Jan. 2002, 7 pages.
Beth Keser et al., "Advanced Packaging: The Redistributed Chip Package", IEEE Transactions on Advanced Packaging, Feb. 2008, pp. 39-43.
Xuejun Fan, "Wafer Level Packaging (WLP): Fan-in, Fan-out and Three-Dimensional Integration", 11th. Int. Conf. on Thermal, Mechanical and Multiphysics Simulation and Experiments in Micro-Electronics and Micro-Systems, Apr. 2010, pp. 1-7.
George A. Riley, "Micro-Posts: Tall, Slender, Stud Bumps", <http://flipchips.com/tutorial/bump-technology/micro-posts-tall-slender-stud-bumps/>, Apr. 2003, 1 page.
Laurie S. Roth et al., "Step 2: Stud Bump Bonding", <http://electroiq.com/blog/2005/02/step-2-stud-bump-bonding/>, Accessed Jun. 30, 2014, 5 pages.
"Dage 4000Plus Bond Tester", <http://www.sinerji-grup.com/bond-tester-systems/dage-4000plus-bond-tester>, Accessed Jun. 30, 2014, 1 page.
"Glass-coated Bonding Wire Targets Copper, Small Diameter Market", <http://electroiq.com/blog/2012/03/glass-coated-bonding-wire-targets-copper-small-diameter-market/>, Accessed Jun. 30, 2014, 4 pages.
U.S. Appl. No. 14/169,254, filed Jan. 31, 2014, entitled "3D Device Packaging Using Through-Substrate Posts".
U.S. Appl. No. 14/039,622, filed Sep. 27, 2014, entitled "3D Device Packaging Using Through-Substrate Pillars".
Daniel D. Evans, Jr., "Geometry and Bond Improvements for Wire Ball Bonding and Ball Bumping", 39th International Symposium on Microelectronics (IMAPS 2006) Proceedings, Oct. 8-12, 2006, 7 pages.
PC Magazine, "Detail of flip-chip bond, stud bump in solder well", <http://www.pcmag.com/image_popup/0%2c1740%2ciid=15942%2c00.asp> Accessed Jul. 3, 2014, 1 page.
Non-Final Office Action mailed Mar. 4, 2015 for U.S. Appl. No. 14/039,622, 32 pages.
Non-Final Office Action mailed Mar. 4, 2015 for U.S. Appl. No. 14/169,254, 32 pages.
Final Office Action mailed Aug. 28, 2015 for U.S. Appl. No. 14/169,254, 28 pages.
Final Office Action mailed Aug. 28, 2015 for U.S. Appl. No. 14/039,622, 28 pages.
Non-Final Office Action mailed Dec. 17, 2015 for U.S. Appl. No. 14/169,254, 29 pages.
Non-final office action dated Apr. 21, 2016 in U.S. Appl. No. 14/039,622.
Final office action dated May 4, 2016 in U.S. Appl. No. 14/169,254.
Notice of Allowance dated Feb. 9, 2016 from U.S. Appl. No. 14/039,622.
Notice of Allowance dated Jul. 20, 2016 in U.S. Appl. No. 14/039,622.
Notice of Allowance dated Jul. 22, 2016 in U.S. Appl. No. 14/169,254.

* cited by examiner

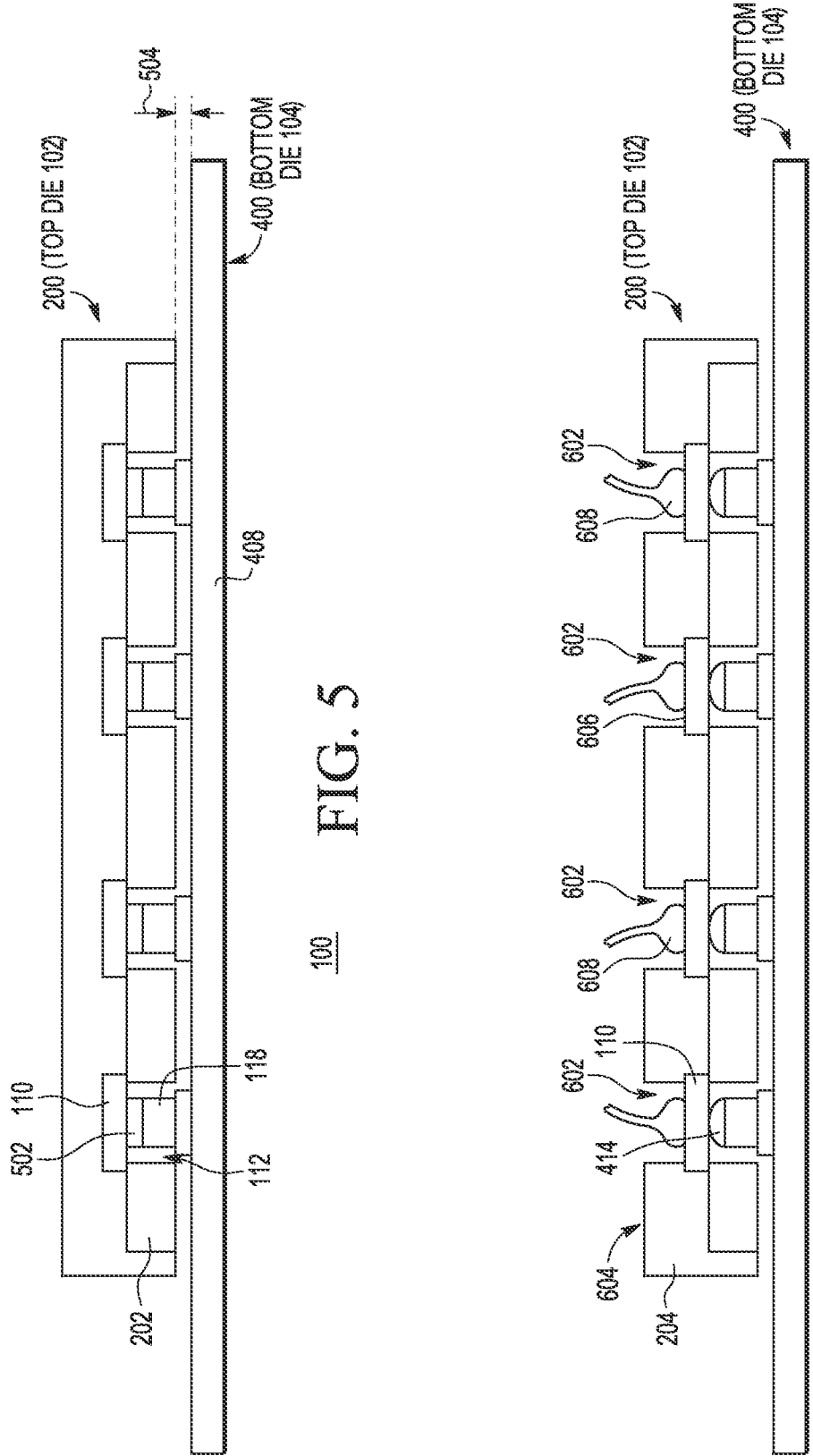

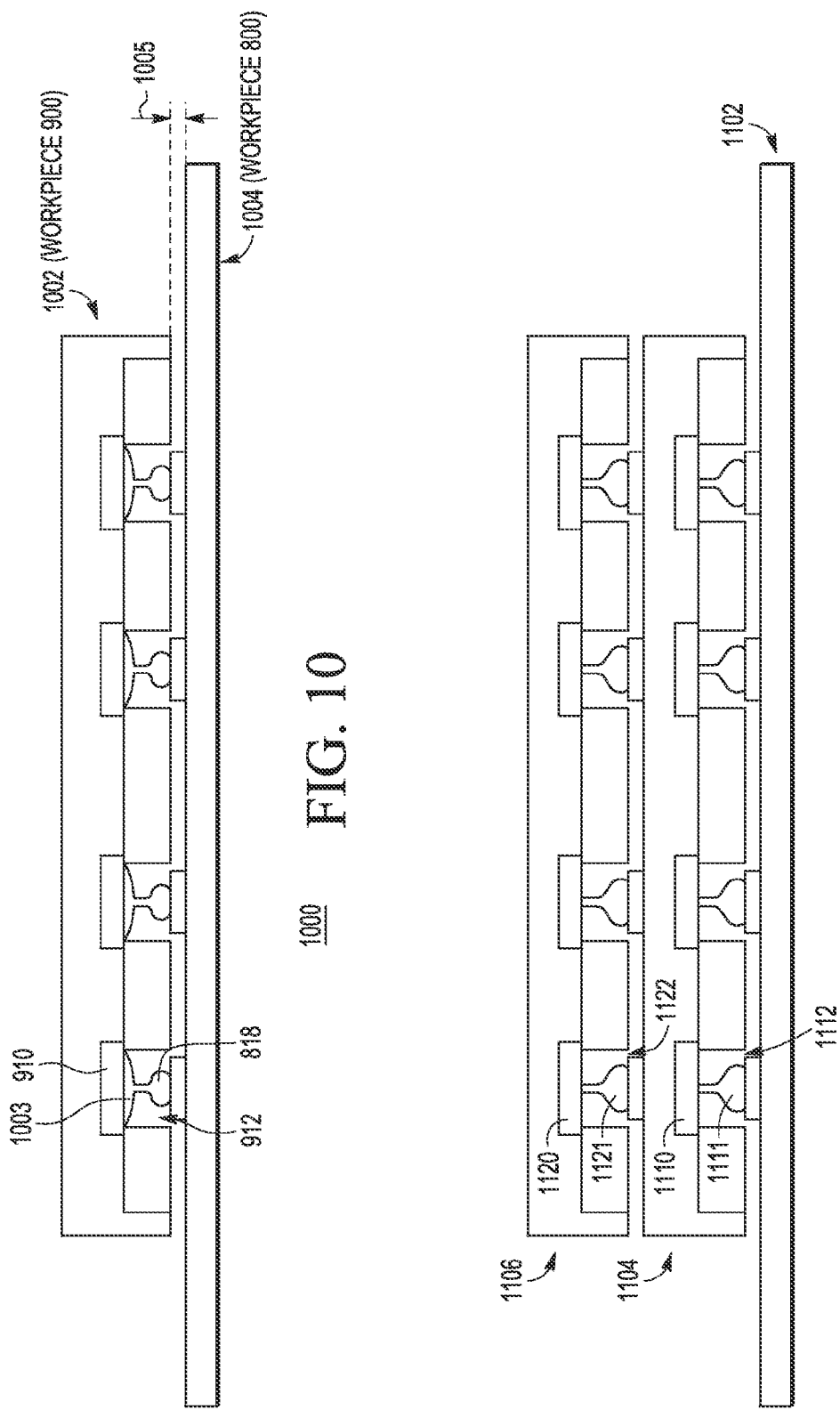

3D DEVICE PACKAGING USING THROUGH-SUBSTRATE POSTS

CROSS-REFERENCE TO RELATED APPLICATIONS

The present application is a continuation-in-part application of U.S. patent application Ser. No. 14/169,254, entitled "3D DEVICE PACKAGING USING THROUGH-SUBSTRATE POSTS" and filed on Jan. 31, 2014, which in turn is a continuation-in-part application of U.S. patent application Ser. No. 14/039,622, entitled "3D DEVICE PACKAGING USING THROUGH-SUBSTRATE PILLARS" and filed on Sep. 27, 2013, the entireties of which is incorporated by reference herein.

BACKGROUND

1. Field of the Disclosure

The present disclosure relates generally to device packaging, and more particularly to three-dimensional (3D) stacked die packaging.

2. Description of the Related Art

Electronic devices often utilize three-dimensional (3D) integrated circuit (IC) packaging to stack two or more dice in a package, which provides a smaller footprint compared to a single larger die or two side-by-side dice connected via an interposer. A common 3D packaging approach for stacking two dice employs a pillar-to-pillar die stacking technique wherein copper pillars are formed on each die and the two dice are then bonded such that each pillar on one die aligns with, and comes into contact with, a corresponding pillar on the other die so as to form a mechanical and electrical bond. However, the copper pillars must be aligned with precision; if one die is angled relative to the other, or the copper pillar bumps are otherwise misaligned, they may not wet (i.e. electrically and mechanically bond). In an attempt to prevent non-wetting, many non-electrically active pillars are added to the dice, increasing the footprint of the technique. Moreover, this pillar-to-pillar die stacking technique creates a large void, or standoff, between the two dice that requires underfill, as well as dams to prevent lateral disbursement of the underfill.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

FIG. 5 is a cross-section view of a 3D package formed by the bonding of the top die and bottom die of FIG. 4 in accordance with some embodiments.

FIG. 6 is a cross-section view of the 3D package of FIG. 5 having a set of wire bonds formed on the pads of the top die via pad openings formed in an encapsulant layer of the top die in accordance with some embodiments.

FIG. 10 is a cross-section view of a 3D package formed by the bonding of the top die and bottom die of FIG. 9 in accordance with some embodiments.

FIG. 11 is a cross-section view of a 3D package having three dice stacked and bonded using a through-substrate stud bump bonding technique in accordance with some embodiments.

DETAILED DESCRIPTION

Figure 1:
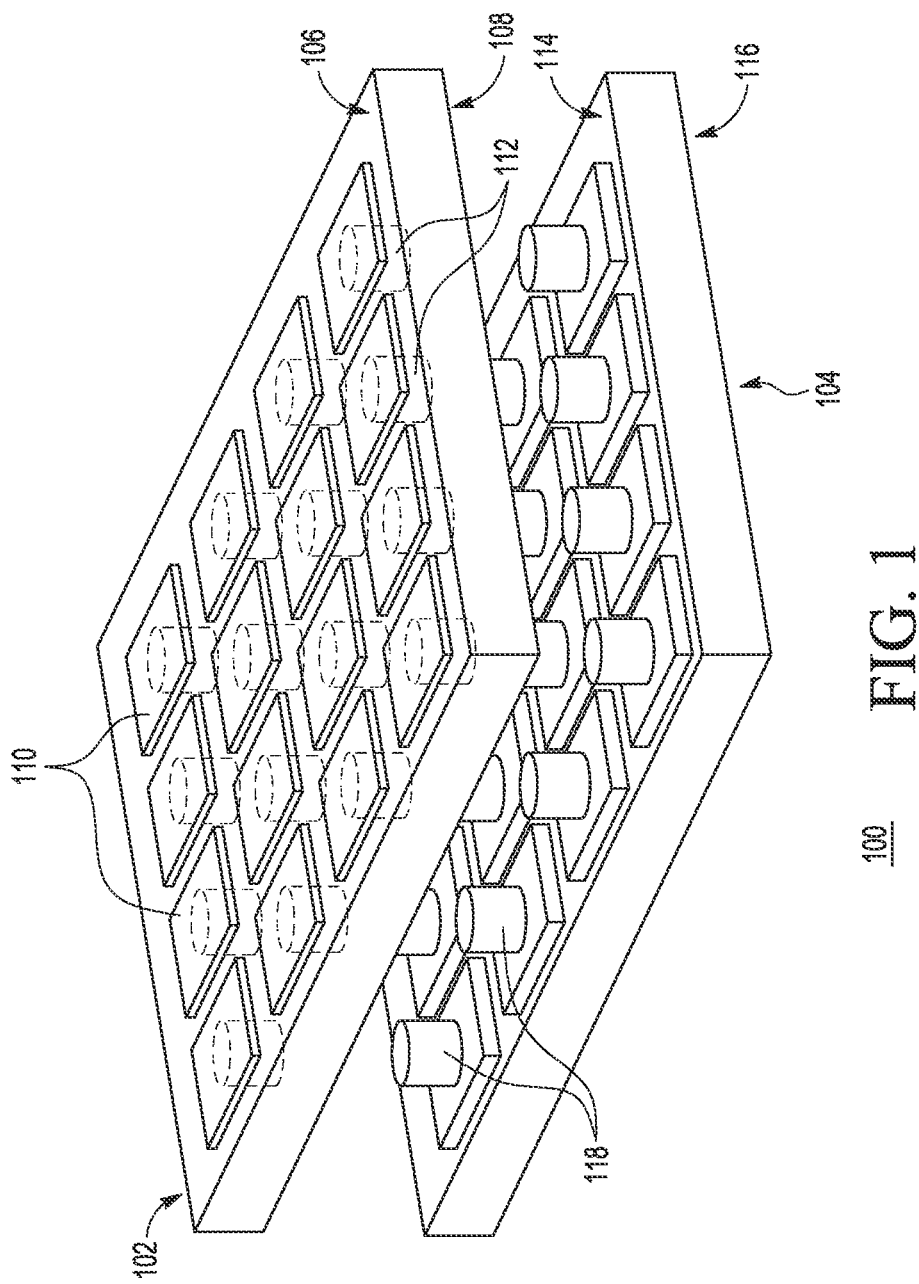
FIG. 1 is an exploded perspective view of a 3D die package implementing a through-substrate pillar bonding technique to bond a top die and a bottom die in accordance with some embodiments.

FIGS. 1-18 illustrate example techniques for 3D device packaging using through-substrate and through-hole post bonding techniques to bond two or more dice in a die stack. A "top" die includes an arrangement of a set of holes at a bottom surface of the top die, each hole may be a through-hole (extending all the way through the top die beyond a top surface of the top die) or an access hole (extending through the top die to a corresponding pad). A "bottom" die includes a set of metal posts disposed at a top surface of the bottom die in an arrangement corresponding to the arrangement of the set of holes of the top die. The top die and the bottom die are bonded in a stacked configuration by inserting the set of metal posts into the set of holes, such that the top die and the bottom die may be mechanically and electrically coupled via the metal posts and holes, such as through a solder reflow process that forms a solder joint between the metal post and the corresponding pad, or other metal layer. Further, "intermediate" dies may be stacked between the top die and the bottom die using similar through-substrate access holes or through-hole post bonding techniques.

While the terms "top" and "bottom" are used throughout this disclosure relative to the orientation of FIGS. 1-18, during fabrication, stacking, bonding, and the like, each component may be used in any of a variety of orientations. Further, as illustrated in greater detail below with reference to FIGS. 1-7, in some embodiments the metal posts may comprise metal pillars formed using, for example, an electroplating process. Using the electroplating process, the pads are treated to ensure good electrical contact and adhesion of the metal pillar to the die. Then the metal is plated to a thickness sufficient that the metal pillars are formed to the desired height.

Alternatively, as illustrated in greater detail below with reference to FIGS. 8-11, in some embodiments the metal posts may comprise stud bumps formed using, for example, a wire-bonding-based process. Using the modified wire bonding technique, a wire ball is formed at a tip of a wire threaded through a capillary of a wire bonding tool. The wire bonding tool manipulates the capillary to bring the distal portion of the wire ball into contact with a bond pad and initiates cold welding, or bonding, of the wire ball to the bond pad through a combination of heat, pressure, and ultrasonic vibration energy applied to the capillary. When the wire ball has welded to the bond pad, the bonding tool manipulates the capillary to cause the wire to break or separate from the wire ball to form the stud bump.

FIGS. 12-18 illustrate example techniques for stacking two or more dice based on the techniques disclosed with reference to FIGS. 1-11. In particular, example techniques utilize metal posts that extend between a top die and a bottom die through corresponding through-holes in one or more intermediate dice to electrically and mechanically couple the top die, the bottom die, and the one or more intermediate dice. These metal posts may be implemented as metal pillars, as metal stud bumps, or as a combination thereof. The use of posts rather than through-silicon vias (TSVs) allows for straight-walled through-holes and access holes, reducing the footprint of the stacking technique.

FIG. 1 illustrates an exploded view of a 3D device package 100 implementing through-substrate metal posts in the form of metal pillars in accordance with some embodiments. The 3D device package 100 typically is configured to be electrically coupled to a printed circuit board (PCB) or other carrier for implementation in an electronic device, which may include, for example, an electronic control system of an automobile or other vehicle, a portable electronic device such as a cellular phone, tablet computer, or notebook computer, a desktop computer, a server, and the like.

In the depicted example, the 3D device package 100 comprises a top die 102 bonded to a bottom die 104 ("top" and "bottom" being relative to the orientation of FIG. 1). Each of the top die 102 and the bottom die 104 comprises one or more substrate layers upon which semiconductor integrated circuit devices or microelectromechanical systems (MEMS) are formed during a front-end-of-line (FEOL) process and one or more metal layers upon which metal interconnects are formed during a back-end-of-line (BEOL) process. The one or more substrate layers can comprise, for example, a single crystal silicon die, a composite wafer of an insulating substrate, such as an epitaxial die, a silicon-on-insulator (SOI) die, or a liquid crystal display (LCD) glass substrate and a semiconductor layer, and the like.

The top die 102 comprises two opposing major surfaces, labeled top surface 106 and bottom surface 108. The top die 102 includes a set of pads 110 disposed in a specified arrangement at one of the metal layers proximate to the top surface 106. For ease of illustration, the set of pads 110 are illustrated as formed at the top metal layer of the top die 102, but in other embodiments the set of pads 110 may be formed at a lower metal layer, or above the top metal layer. The top die 102 further includes a set of access holes 112 in an arrangement compatible with the arrangement of pads 110 such that each access hole 112 is coaxially aligned with a corresponding pad 110 and extends from the bottom surface 108 to the underlying surface of the corresponding pad 110. In some embodiments, the walls of the access holes 112 are substantially perpendicular (90 degrees+/−10 degrees) to the bottom surface 108, thereby allowing a higher density of such access holes. In some embodiments, the bottom surface 108 corresponds with a backside of the top die 102, and the access holes 112 are formed at the backside of the top die 102.

The bottom die 104 likewise comprises two major opposing surfaces, labeled top surface 114 and bottom surface 116. The bottom die 104 includes a set of metal pillars 118 disposed at the top surface 114 in an arrangement corresponding to the arrangement of the access holes 112. The set of metal pillars 118 extend away from the bottom die 104 in a direction substantially perpendicular to the top surface 114. For ease of illustration, the metal pillars 118 are described herein in the example context of copper (Cu) pillars, but in other embodiments the metal pillars 118 may be composed of other metals, such as aluminum (Al), gold (Au), silver (Ag), platinum (Pt), nickel (Ni), or a combination of metals. The metal pillars 118 and the access holes 112 are dimensioned such that the metal pillars 118 can be inserted into the access holes 112 when the top die 102 and the bottom die 104 are stacked or bonded to form the 3D device package 100, as described below. In some embodiments, a layer of dielectric may be formed on the inside surface of the access holes 112 to provide insulation between the metal pillars 118 of the bottom die 104 and the substrate of the top die 102.

For ease of illustration, the sizes of the pads 110, access holes 112, and metal pillars 118 are exaggerated relative to the dice 102, 104. Moreover, although FIG. 1 depicts sixteen pads 110 in a uniform 4×4 grid arrangement (as well as sixteen access holes 112 and sixteen metal pillars 118 in corresponding 4×4 grid arrangements), in typical implementations the numbers of pads 110, access holes 112, and metal pillars 118 typically are much greater than the sets of sixteen of each as shown, and these components may be compatibly arranged in arrangements other than a grid (e.g., an approximate ring, perimeter, checkerboard pattern, etc.).

Although depicted in an exploded view in FIG. 1, during fabrication of the 3D device package 100, the top die 102 and the bottom die 104 are bonded together with the bottom surface 108 of the top die 102 facing the top surface 114 of the bottom die 104. The corresponding arrangements of the set of metal pillars 118, the set of access holes 112, and the set of pads 110 result in the insertion of each metal pillar 118 into a corresponding access hole 112 during the die bonding process. Moreover, the height of the metal pillars 118 is compatible with the substrate thickness of the top die 102 between the metal layer containing the set of pads 110 and the bottom surface 108 such that the metal pillar 118 is brought into contact with the pad 110 overlying the corresponding access hole 112 during the die stacking process. The metal pillars 118 may be tipped with solder material so that after the dice 102, 104 are stacked, a solder reflow process may be performed to form a solder joint between the metal pillar 118 and the pad 110, thus forming a mechanical and electrical bond between the metal pillar 118 and the corresponding pad 110.

With electrical pathways formed between the top die 102 and the bottom die 104 via the pads 110 and the metal pillars 118, some or all of the pads 110 and the metal pillars 118 may be used to conduct signaling or power between the dice 102, 104. In such instances, the pads 110 are connected to the metal interconnect structure formed in the metal layers of the die 102 and the metal pillars 118 are connected to the metal interconnect structure formed in the metal layers of the die 104. Power and signaling therefore may be conducted between the top die 102 and the bottom die 104 via these metal interconnect structures, the metal pillars 118, and the pads 110. Moreover, in some instances, some or all of the metal pillar-pad junctions may be electrically inactive, that is, not used for conducting signaling or power between the dice 102, 104, and instead used solely for bolstering the mechanical bonding between the dice 102, 104 or otherwise bolstering the structural integrity of the resulting 3D device package 100. In such instances, one or both of the metal pillar 118 and the pad 110 of an electrically-inactive pillar-pad junction may be electrically isolated from the other metal interconnects of the corresponding die.

As illustrated with greater detail below with reference to FIG. 5, this front-through-back approach of connecting the metal pillars 118 of the bottom die 104 to the pads 110 of the top die 102 through the substrate of the top die 102 (that is, through the "back end" of the top die 102) reduces the risk of non-wetting pillar connections compared to conventional pillar-to-pillar stacking approaches. Moreover, this approach reduces the standoff distance between the bottom surface 108 of the top die 102 and the top surface 114 of the bottom die 104, and thus facilitates the fabrication of a more compact die stack while reducing or eliminating the need for underfill between the two dice, as well as the need for dam structures to contain such underfill between the two dice.

FIGS. 2-6 sequentially illustrate an example process of fabricating the 3D device package 100 using a through-substrate pillar bonding technique. As with the view depicted in FIG. 1, the dimensions of the metal pillars, access holes, and pads are exaggerated relative to other features of the dice 102, 104 for purposes of illustration.

Figure 2:
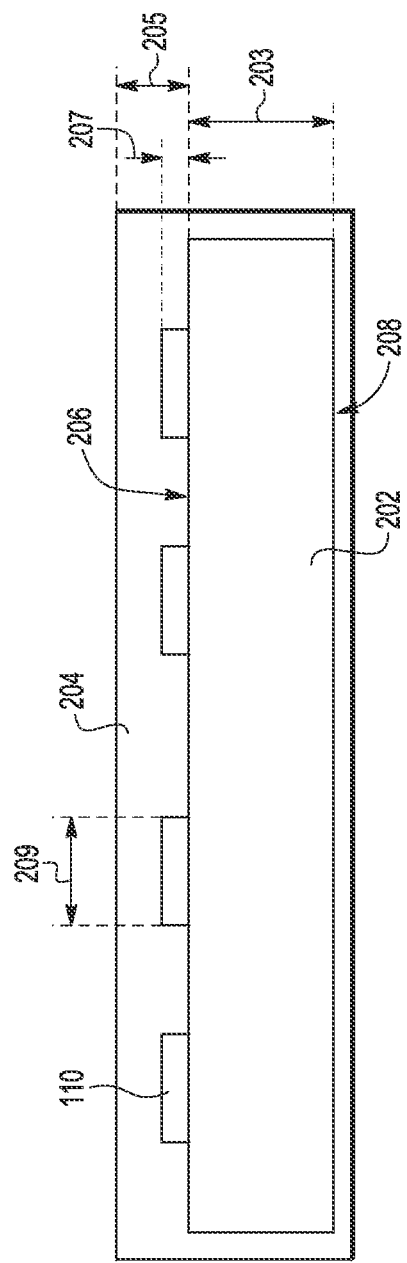
FIG. 2 is a cross-section view of a top die after formation of a set of pads at a surface metal layer in accordance with some embodiments.

FIG. 2 illustrates a cross-section view of a workpiece 200 that ultimately forms the top die 102 of FIG. 1 in accordance with some embodiments. In the depicted stage, a die 202 (corresponding to the top die 102) having an initial thickness 203 has been singulated from a wafer and encapsulated in an encapsulating material 204, such as a heat-curable epoxy-based resin. In some embodiments the encapsulating material 204 may be applied before die singulation and thus the encapsulating material 204 may cover only the top surface 206 (corresponding to the top surface 106, FIG. 1) of the die 202 to a thickness 205, while in other embodiments the die 202 may be encapsulated after singulation, and thus the encapsulating material 204 may cover the top surface 206, the opposing bottom surface 208, and side surfaces of the die 202. An example range of the die thickness 203 10-300 μm, and an example range of the encapsulant thickness 205 at the top surface 206 is 50-400 μm.

In the depicted example, the pads 110 are formed at the surface, or top, metal layer of the die 202, and thus the encapsulating material 204 may directly overlie the pads 110 and any passivation layer formed over the pads 110. The pads 110 may be composed of any of a variety of conductive materials or combinations thereof, such as aluminum, copper, gold, silver, tungsten, nickel, and the like. As noted, the pads 110 are used to contact corresponding metal pillars inserted through the bottom surface 108 of the top die 102, and thus the pads 110 are formed to a thickness 207 suitable to reduce the likelihood of flexion of the pads responsive to this contact. To illustrate, a pad thickness 207 of at least 5,000 angstroms has been found to sufficiently guard against excessive flexion of the pads 110. Moreover, the pads 110 have a width 209 greater than the diameter of the access holes 112 (FIG. 1) formed thereunder, and thus permitting the pads 110 to sufficiently bridge over the openings of the access holes 112. An example range of the pad width 209 is 20-200 μm.

Figure 3:
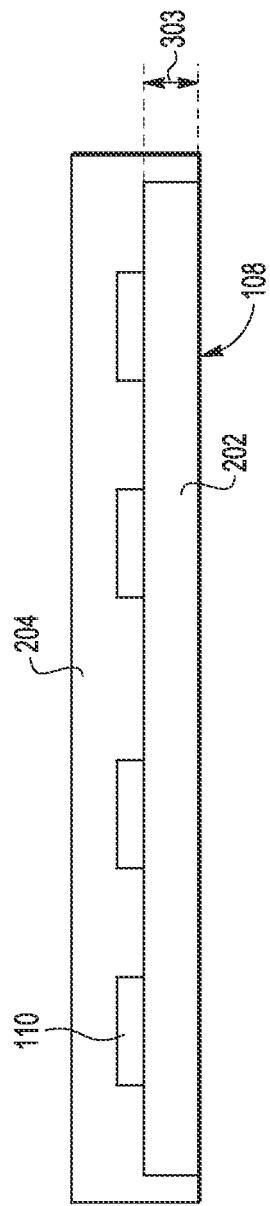
FIG. 3 is a cross-section view of the top die of FIG. 2 after back-grinding a bottom surface of the top die in accordance with some embodiments.

FIG. 3 illustrates a cross-section view of the workpiece 200 after backgrinding of the die 202 at the bottom surface 208 (FIG. 2), and any encapsulant material 204 that may have initially overlain the bottom surface 208. The backgrinding may be performed using any of a variety of suitable techniques, for example mechanical backgrinding, chemical backgrinding, and the like. In some instances, the backgrinding is performed on a wafer prior to die singulation, and in other instances the backgrinding may be performed on the die 202 after singulation. The backgrinding reduces the distance between the bottom surface 108 of the top die 102 and the underside of the pads 110 to a reduced thickness 303 that corresponds to a height of the metal pillars 118 (FIG. 1) less a specified standoff between the bottom surface 108 of the top die 102 (FIG. 1) and the top surface 114 (FIG. 1) of the bottom die 104 (FIG. 1). That is, if the pads 110 are disposed at a top surface 206 of the die 202, the die 202 is background to a reduced thickness 303 so that when the workpiece 200 (as the top die 102) is bonded to the bottom die 104, the metal pillars 118 reach the undersides of the pads 110 while a bottom surface 108 of the die 202 is separated from the top surface 114 of the bottom die 104 by a specified standoff distance.

Figure 4:
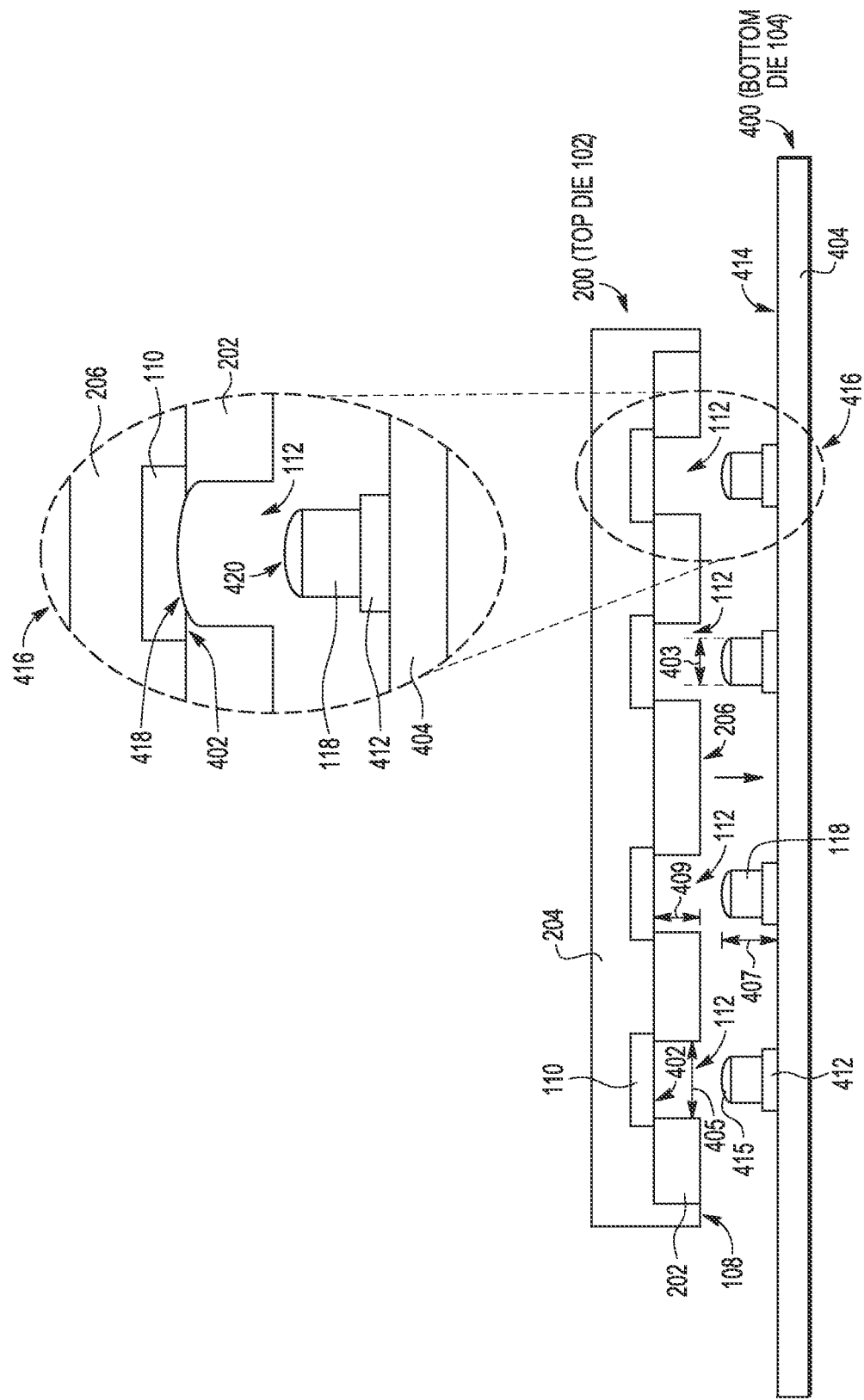
FIG. 4 is a cross-section view of the top die of FIG. 3 after formation of a set of access holes and a cross-section view of a bottom die having a set of metal pillars formed in an arrangement compatible with the set of access holes in accordance with some embodiments.

FIG. 4 illustrates cross-section views of the workpiece 200 (corresponding to the top die 102) and a workpiece 400 (corresponding to the bottom die 104) in the process of stacking or bonding the workpieces 200, 400. In the depicted view, the set of access holes 112 have been formed at the bottom surface 108 of the encapsulated die 202. Each access hole 112 extends substantially perpendicular from the bottom surface 108 to an underlying surface 402 of a corresponding pad 110 of the set of pads 110. The access holes 112 may be formed using any of a variety of suitable techniques, such as etching, mechanical drilling, laser ablation, and the like. In some embodiments, the bottom surface 108 corresponds to a backside of the encapsulated die 202, and the access holes 112 are formed at the backside of the encapsulated die 202.

The workpiece 400 comprises a die 404 (corresponding to the bottom die 104 of FIG. 1) having the set of metal pillars 118 formed at a top surface 414 of the die 404 in an arrangement compatible with the arrangement of pads 110 and access holes 112 in the workpiece 200. The metal pillars 118 may be formed using any of a variety of conventional pillar formation techniques. In some embodiments, the metal pillars 118 are seated on a base 412. The metal pillars 118 each include a contact surface, which may comprise a solder deposit 415 to create a solder joint between the metal pillar 118 and the pad 110 once the workpieces 200, 400 have been stacked and bonded. The metal pillars 118 have a diameter 403 (e.g., 5-150 µm) less than a diameter 405 (e.g., 5.1-155 µm) of the access holes 112 and a height 407 (e.g., 10.2-300.2 µm) greater than a depth 409 (e.g., 10-300.1 µm) of the access holes 112, thereby permitting the metal pillars 118 to extend into the access holes 112 and contact the underlying surfaces 402 of the pads 110.

As illustrated by detail view 416, in some embodiments the end "caps" of the access holes 112 are formed to correspond to the shape of the contact surface 420 of the corresponding metal pillars 118. For example, a concave surface 418 may be formed in the substrate of the top die 202 and in the underlying surface 402 of the pad 110 by, for example, selective etching to correspond to a convex contact surface 420 of the corresponding metal pillar 118. In some embodiments, the concave surface 418 may be formed only in the underlying surface 402 of the pad 110. This concave surface 418 provides a seat to help align the metal pillars 118 in the access holes 112 as the workpieces 200, 400 are joined.

FIG. 5 illustrates a cross-section view of the 3D device package 100 resulting from the bonding of the workpiece 200 (representing the top die 102) and the workpiece 400 (representing the bottom die 104). At the depicted stage, the metal pillars 118 have been inserted into the corresponding access holes 112 such that the contact surface 420 of each metal pillar 118 is brought into contact with the underlying surface 402 (FIG. 4) of the corresponding pad 110 and a solder reflow is performed to create a solder joint 502 between the metal pillar 118 and the corresponding pad 110, and thus electrically and mechanically coupling metal pillars 118 with the corresponding pads 110. As illustrated in FIG. 5, using this through-substrate pillar bonding technique, the metal pillars 118 and pads 110 provide mechanical and electrical connections between the dice 102, 104 in a manner that brings the facing surfaces of the dice 102, 104 closer together, resulting in a reduced standoff height 504 between the dice 102, 104, which in turn reduces or eliminates the need for underfill and underfill-containing dam structures, as well as provides for more reliable wetting of the metal pillars 118 during the bonding process.

FIG. 6 illustrates a cross-section view of a 3D device package 600 in which pad openings for test probing or wire bond formation may be formed. In the depicted embodiment, the 3D device package 600 was formed in accordance with the process described above with reference to FIGS. 1-5. As a further processing step, to provide access to the pads 110 a set of pad openings 602 are formed to extend from a top surface 604 of the encapsulant material 204 to top surfaces 606 of some or all of the pads 110. The pad openings 602 may be formed using etching, laser ablation, mechanical drilling, and the like. These pad openings 602 may be used to provide test probes access to the pads 110 during a test process, or to facilitate the formation of wire bonds 608 with the pads 110.

Figure 7:
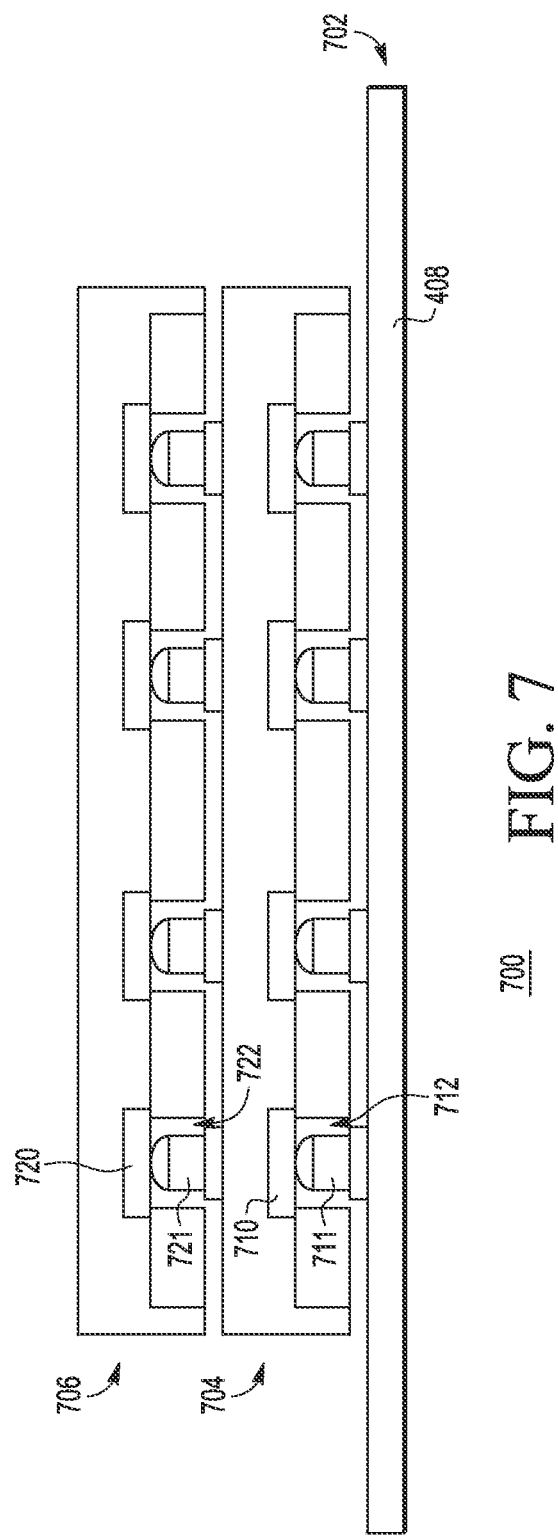
FIG. 7 is a cross-section view of a 3D package having three dice stacked and bonded using a through-substrate pillar bonding technique in accordance with some embodiments.

FIG. 7 illustrates a 3D device package 700 formed from three dice stacked in accordance with the through-substrate pillar bonding technique described herein. As illustrated, the 3D device package 700 is formed from three dice 702, 704, 706, with the die 702 having a set of metal pillars 711 bonded to pads 710 of the die 704 via access holes 712 formed at the backside of the die 704. Similarly, the die 704 has a set of metal pillars 721 formed at the topside of the die 704, and which are bonded to pads 720 of the die 706 via access holes 722 formed at the backside of the die 706. While in the present example the metal pillars 711 of die 702 align with the metal pillars 721 of die 704, in other embodiments, the metal pillars 711 of die 702 do not align with the metal pillars 721 of die 704, and the metal pillars of any given die in a 3D device package need not be arranged to correspond with the metal pillars of another die in the stack. In some embodiments, die 704 may have metal pillars 721 formed directly on the pads 710 such that the metal pillars 721 are electrically and mechanically coupled to the pads 710. This same process may be extended to stack more than three die. Furthermore, the through-substrate pillar bonding technique may be employed in combination with other die bonding techniques to form a multiple-die stack in a 3D device package.

FIGS. 1-7 primarily illustrate embodiments of 3D packaging techniques using through-substrate metal posts in the form of metal pillars. Turning now to FIGS. 8-11, embodiments of 3D packaging techniques using through-substrate metal posts in the form of stud bumps are illustrated. As with the metal-pillar-based 3D package 100 illustrated in FIG. 1, a stud-bump-based implementation also provides for the formation of an array of metal posts (in the form of stud bumps) at a bottom die that electrically and mechanically couple with corresponding pads in a top die via access holes formed in the substrate of the top die. In view of this similarity to the metal pillar implementation, the stud bump implementation is described below with reference to the analogous context of the 3D package 100 of FIG. 1.

Figure 8:
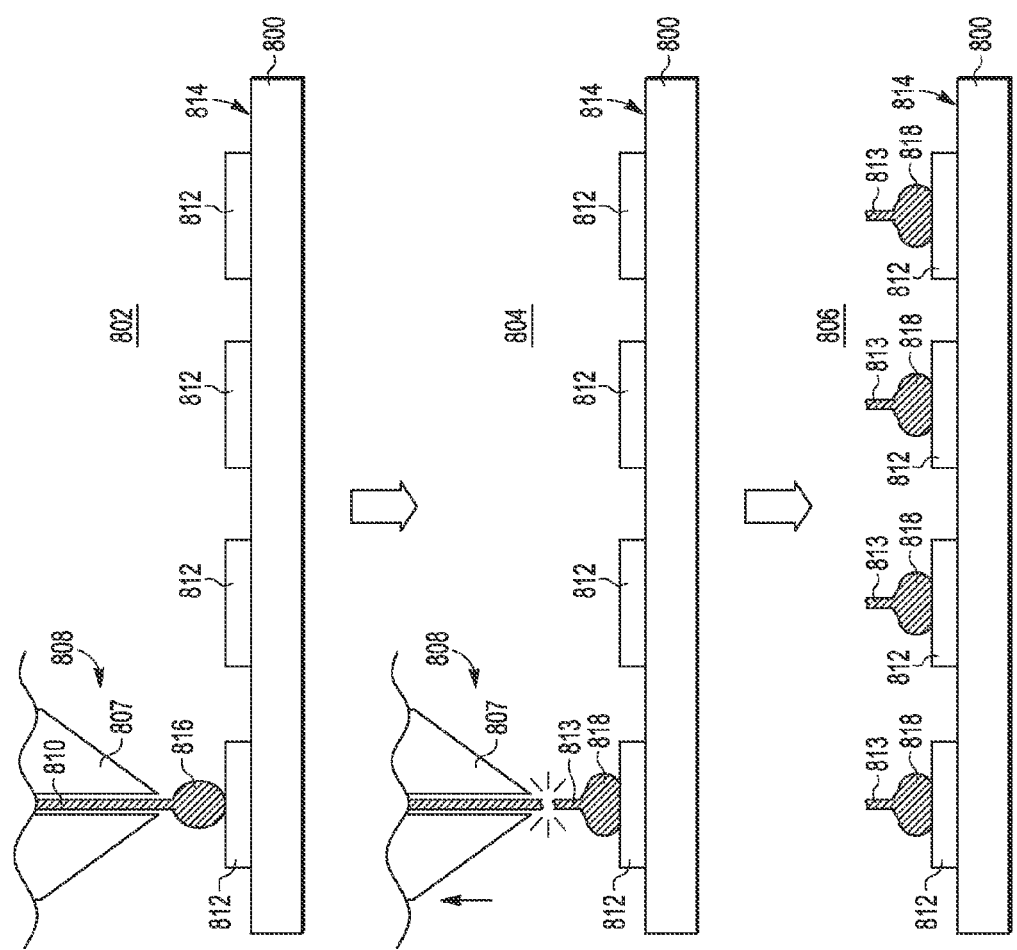
FIG. 8 is a series of cross-section views illustrating formation of stud bumps at a bottom die of a 3D package in accordance with some embodiments.

FIG. 8 illustrates a series of cross-section views 802, 804, 806 depicting an example technique for forming stud bumps 818 on a workpiece 800 using a wire bonding tool 808 in accordance with some embodiments. The workpiece 800 represents a bottom die (analogous to the bottom die 104) of a stub-bump-based 3D package 1000 (see FIG. 10) to be formed. The workpiece 800 is shown as having a plurality of bond pads 812 disposed at a top surface 814 of the workpiece 800 in an arrangement (e.g., an array or grid as shown for the 3D package 100 of FIG. 1) corresponding to the arrangement of access holes in a top die of the 3D package 1000 (FIG. 10). The bond pads 812 may be composed of any of a variety of materials or combinations thereof, such as gold (Au), silver (Ag), palladium (Pd), copper (Cu), aluminum (Al), nickel (Ni), composite materials, and the like.

Cross-section views 802 and 804 illustrate the process of forming a single stud bump 818 at a corresponding bond pad 812, and this process may be repeated for each stud bump 818 to be formed at the workpiece 800. As illustrated by cross-section view 802, a wire ball 816 is formed at a tip of a wire 810 threaded through a capillary 807 of a wire bonding tool 808. The wire 810 can comprise any of a variety of relatively soft metals or metal alloys, such as Au, Ag, Cu, Al, Palladium-Silver (PdAg), and the like. The wire ball 816 may be formed as a free air ball created through the melting of the tip of the wire 810 using, for example, an electronic flame off (EFO) process. As illustrated by cross-section view 804, the wire bonding tool 808 manipulates the capillary 807 to bring the distal portion of the wire ball 816 into contact with the bond pad 812 of the workpiece 800. The bonding tool 808 initiates cold welding, or bonding, of the wire ball 816 to the bond pad 812 through a combination of heat, pressure, and ultrasonic vibration energy applied to the capillary 807. When the wire ball 816 has welded to the bond pad 812, the bonding tool 808 manipulates the capillary 807 to draw the capillary 807 away from the bond pad 812, which in turn causes the wire 810 to break or separate from the wire ball 816, and thus forming the stud bump 818, which includes the wire ball 816 and a tail 813 of wire extending generally perpendicular to the top surface 814 As illustrated by cross-section view 804, this stud bump formation technique is repeated so as to form a stud bump 818 at each bond pad 812 of the workpiece 800.

Figure 9:
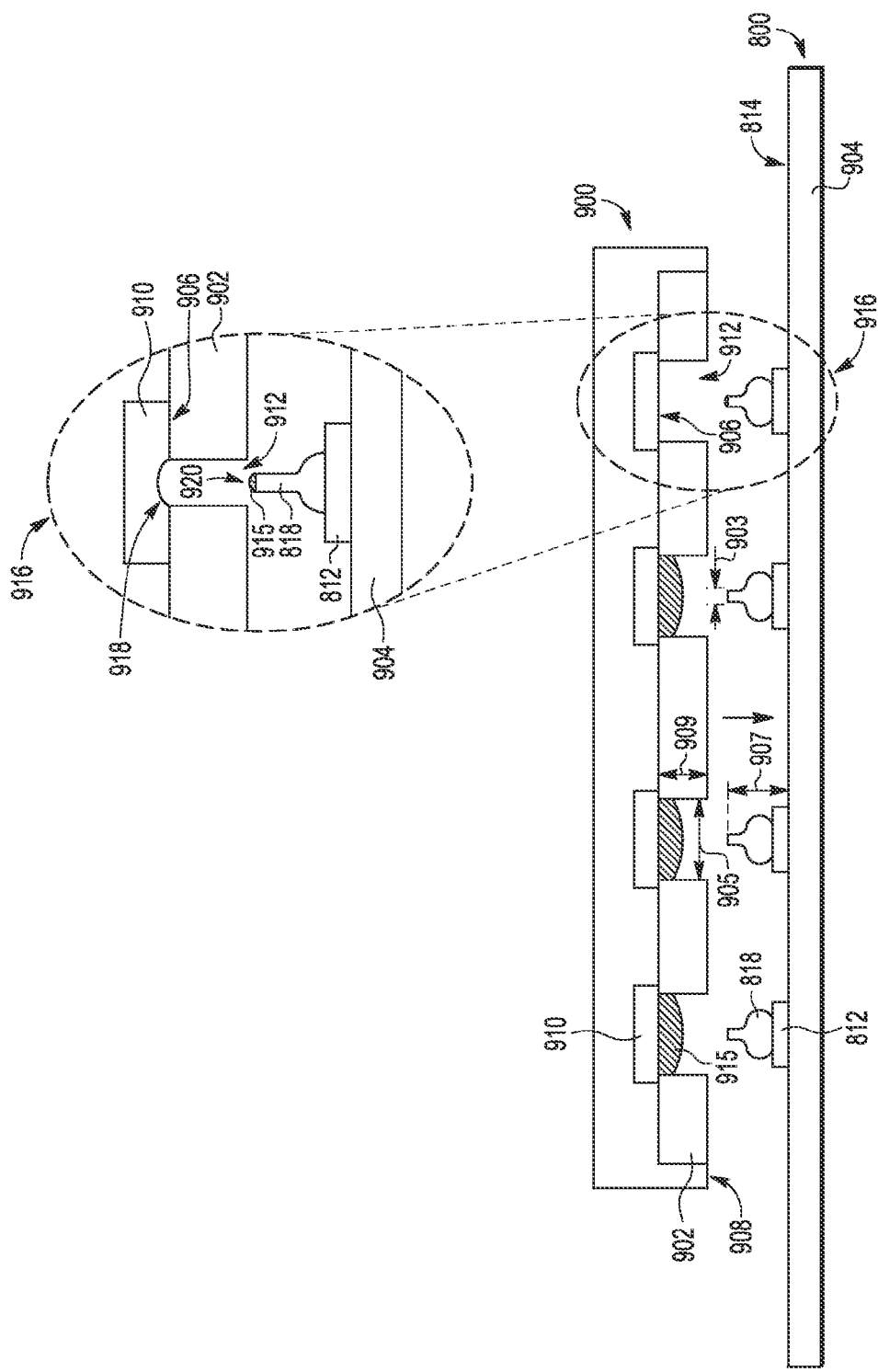
FIG. 9 is a cross-section view of a top die after formation of a set of access holes and a cross-section view of a bottom die having a set of stud bumps formed in an arrangement compatible with the set of access holes in accordance with some embodiments.

FIG. 9 illustrates a cross-section view of the workpiece 800 and a workpiece 900 in the process of being stacked or otherwise bonded to form the 3D package 1000 (FIG. 10). As noted above, the workpiece 800 is a bottom die analogous to the bottom die 104 of the 3D package 100 of FIG. 1. Similarly, the workpiece 900 is a top die analogous to the top die 102 of the 3D package 100. In the depicted view, a set of access holes 912 (analogous to the access holes 112 of FIG. 1) have been formed at the bottom surface 908 of an encapsulated die 902 (analogous to the encapsulated die 202 of FIG. 2). Each access hole 912 extends substantially perpendicular from the bottom surface 908 to an underlying surface 906 of a corresponding pad 910 of a set of pads formed at one or more metal layers of the workpiece 900. The access holes 912 may be formed using any of a variety of suitable techniques, such as etching, mechanical drilling, laser ablation, and the like. In some embodiments, the bottom surface 908 corresponds to a backside of the encapsulated die 902.

The workpiece 800 comprises a die 904 (analogous to the bottom die 104 of FIG. 1) having the set of stud bumps 818 formed at the top surface 814 of the die 904 in an arrangement compatible with the arrangement of pads 910 and access holes 912 in the workpiece 900. In some embodiments, the stud bumps 818 are seated on a base or bond pad 812.

The stud bumps 818 and the access holes 912 are dimensioned such that the stud bumps 818 can be inserted into the access holes 912 when a bottom die formed from the workpiece 800 and a top die formed from the workpiece 900 are stacked or bonded to form the 3D device package 1000, as described below with reference to FIG. 10. To illustrate, the stud bumps 818 have a diameter 903 (e.g., 5-150 µm) less than a diameter 905 (e.g., 5.1-155 µm) of the access holes 912 and a height 907 (e.g., 10.2-300.2 µm) greater than a depth 909 (e.g., 10-300.1 µm) of the access holes 912, thereby permitting the stud bumps 818 to extend into the access holes 912 and contact the underlying surfaces 902 of the pads 910. In some embodiments, a layer of dielectric material may be formed on the inside surface of the access holes 912 to provide insulation between the stud bumps 818 of the bottom die 904 and the substrate of the top die 102.

As illustrated by detailed view 916, the stud bumps 818 each include a contact surface 920. In some embodiments, a solder deposit 915 is formed at the contact surface 920 for use in creating a solder joint between the stud bump 818 and the corresponding pad 910 once the workpieces 800, 900 have been stacked and bonded. However, it can be impractical to accurately deposit solder material on the stud bump 818 itself. Thus, in some embodiments, solder material is deposited in the access holes 912 against the underlying surfaces 902 of the bond pads 910 so as to form solder fills 915 in the access holes 912. These solder fills 915 are then used to form solder joints between the stud bumps 818 (or the metal pillars 118 in the embodiment described above with reference to FIGS. 1-7) and the access pads 910 via solder reflow.

As also illustrated by detail view 916, in some embodiments implementing the solder deposit 915 formed at the contact surface 920 of each stud bump 818, the end "caps" of the access holes 912 are formed with a contour that corresponds to the shape of the contact surface 920 of the corresponding stud bumps 818. For example, a concave surface 918 may be formed in the substrate of the top die 202 and in the underlying surface 906 of the pad 110 via, for example, selective etching to correspond to a convex contact surface 920 of the corresponding stud bump 818. In some embodiments, the concave surface 918 may be formed only in the underlying surface 906 of the pad 910. This concave surface 918 provides a seat to help align the stud bumps 818 in the access holes 912 as the workpieces 800, 900 are joined.

FIG. 10 illustrates a cross-section view of a 3D device package 1000 resulting from the bonding of a top die 1002 (formed from the processing of the workpiece 900 described above) and a bottom die 1004 (formed from the processing of the workpiece 800 described above) using stud bumps 818 as the metal posts interconnecting the two. At the depicted stage, the stud bumps 818 have been inserted into the corresponding access holes 912 such that the contact surface 920 of each stud bump 818 is brought into contact with the underlying surface 906 (FIG. 9) of the corresponding pad 910 and a solder reflow is performed of the solder fills 915 (FIG. 9) disposed in the access holes 912 so as to create a solder joint 1003 between each stud bump 818 and its corresponding pad 910, and thus electrically and mechanically coupling stud bumps 818 with the corresponding pads 910. Using this through-substrate stud bump bonding technique, the stud bumps 818 and pads 910 provide mechanical and electrical connections between the dice 1002, 1004 in a manner that brings the facing surfaces of the dice 1002, 1004 closer together, resulting in a reduced standoff height 1005 between the dice 1002, 1004, which in turn reduces or eliminates the need for underfill and underfill-containing dam structures, as well as provides for more reliable wetting of the stud bumps 818 during the bonding process.

FIG. 11 illustrates a 3D device package 1100 formed from three dice stacked in accordance with the through-substrate stud bump bonding technique described herein. As illustrated, the 3D device package 1100 is formed from three dice 1102, 1104, 1106, with the die 1102 having a set of stud bumps 1111 bonded to pads 1110 of the die 1104 via access holes 1112 formed at the backside of the die 1104. Similarly, the die 1104 has a set of stud bumps 1121 formed at the topside of the die 1104, and which are bonded to pads 1120 of the die 1106 via access holes 1122 formed at the backside of the die 1106. While in the present example the stud bumps 1111 of die 1102 align with the stud bumps 1121 of die 1104, in other embodiments, the stud bumps 1111 of die 1102 do not align with the stud bumps 1121 of die 1104, and the stud bumps of any given die in a 3D device package need not be arranged to correspond with the stud bumps of another die in the stack. In some embodiments, die 1104 may have stud bumps 1121 formed directly on the pads 1110 such that the stud bumps 1121 are electrically and mechanically coupled to the pads 1110. This same process may be extended to stack more than three die. Furthermore, the through-substrate stud bump bonding technique may be employed in combination with other die bonding techniques to form a multiple-die stack in a 3D device package.

Similar to the metal pillar 3D device package 600 described above with reference to FIG. 6, in some embodiments, a stud bump implementation of a 3D device package may comprise pad openings for test probing or wire bond formation. The set of pad openings may be formed (using etching, laser ablation, mechanical drilling, and the like) to extend from a top surface of the encapsulant material to the top surfaces of some or all of the pads (e.g., like pads 110 of FIG. 6). These pad openings may be used to provide test probes access to the pads of the stud bump implementation of the 3D device package during a test process, or to facilitate the formation of wire bonds with the pads.

FIGS. 12-18 illustrate example techniques for stacking two or more dice based on the techniques disclosed above with reference to FIGS. 1-11. In particular, the die-stacking techniques described below utilize metal posts that extend between a top die and a bottom die through corresponding through-holes in one or more intermediate dice to electrically and mechanically couple the top die, the bottom die, and the one or more intermediate dice. These metal posts may be implemented as metal pillars, as metal stud bumps, or as a combination thereof.

Figure 12:
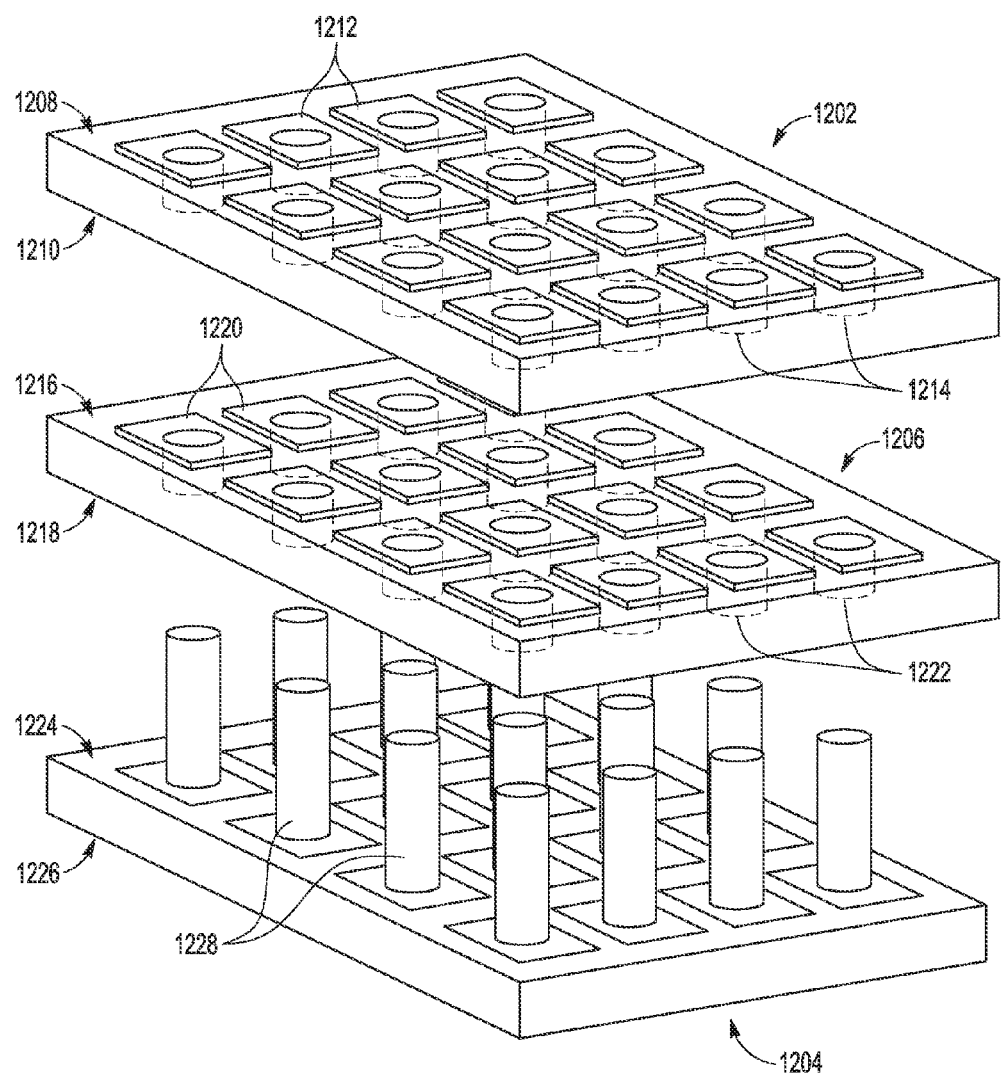
FIG. 12 is an exploded perspective view of a 3D die package implementing a through-hole post bonding technique to bond a top die, an intermediate die, and a bottom die in accordance with some embodiments.

FIG. 12 illustrates an exploded view of a 3D device package 1200 implementing through-holes and metal posts in the form of metal pillars to stack two or more dice in accordance with some embodiments. The 3D device package 1200 typically is configured to be electrically coupled to a printed circuit board (PCB) or other carrier for implementation in an electronic device, which may include, for example, an electronic control system of an automobile or other vehicle, a portable electronic device such as a cellular phone, tablet computer, or notebook computer, a desktop computer, a server, and the like.

In the depicted example, the 3D device package 1200 comprises three bonded dice, including a top die 1202, a bottom die 1204, and an intermediate die 1206 ("top" and "bottom" being relative to the orientation of FIG. 12). Each of the top die 1202, intermediate die 1206, and bottom die 1204 comprises one or more substrate layers upon which semiconductor integrated circuit devices or microelectromechanical systems (MEMS) are formed during a front-end-of-line (FEOL) process and one or more metal layers upon which metal interconnects are formed during a back-end-of-line (BEOL) process. The one or more substrate layers can comprise, for example, a single crystal silicon die, a composite wafer of an insulating substrate, such as an epitaxial die, a silicon-on-insulator (SOI) die, or a liquid crystal display (LCD) glass substrate and a semiconductor layer, and the like. Although the 3D device package 1200 is illustrated with reference to a three-dice embodiment, the present disclosure is not limited to such embodiments. Thus, in other embodiments, the 3D device package may be implemented as a two-dice package using the bottom die 1204 and intermediate die 1206. The two-dice package then may be implemented in a system, or a third die, such as the top die 1202, may subsequently be connected to the two-dice package to form the illustrated three-dice package 1200.

The top die 1202 comprises two opposing major surfaces, labeled top surface 1208 and bottom surface 1210. The top die 1202 includes a set of pads 1212 disposed in a specified arrangement at one of the metal layers proximate to the top surface 1208. For ease of illustration, the set of pads 1212 are illustrated as formed at the top metal layer of the top die 1202, but in other embodiments the set of pads 1212 may be formed at a lower metal layer, or above the top metal layer. The top die 1202 further includes a set of holes 1214 in an arrangement compatible with the arrangement of pads 1212 such that each hole 1214 is coaxially aligned with a corresponding pad 1212. In at least one embodiment, the set of holes 1214 comprises a set of access holes, such that each access hole extends from the bottom surface 1210 to the underlying surface of the corresponding pad 1212. In the illustrated embodiment, the set of holes 1214 comprises a set of through-holes, such that each hole extends through the top die 1202 between the top surface 1208 and the bottom surface 1210, and through the corresponding pad 1212, preventing the need for a connector to land on the corresponding pad 1212. In some embodiments, the walls of the holes 1214 are substantially perpendicular (90 degrees+/−10 degrees) to the bottom surface 1210, thereby allowing a higher density of such access holes. In some embodiments, the bottom surface 1210 corresponds with a backside of the top die 1202, and the holes 1214 are formed at the backside of the top die 1202.

Similarly, the intermediate die 1206 comprises two opposing major surfaces, labeled top surface 1216 and bottom surface 1218. The intermediate die 1206 includes a set of pads 1220 disposed in a specified arrangement at the top surface 1216 of the intermediate die 1206. The intermediate die 1206 further includes a set of through-holes 1222 in an arrangement compatible with the arrangement of pads 1220 such that each through-hole 1222 is coaxially aligned with a corresponding pad 1220, and each through-hole 1222 extends through the corresponding pad 1220, and traverses the entirety of the intermediate die 1206 between the surfaces 1216 and 1218, preventing the need for a connector to land on the corresponding pad 1220. In some embodiments, the walls of the through-holes 1222 are substantially perpendicular (90 degrees+/−10 degrees) to the bottom surface 1218, thereby allowing a higher density of such access holes. In some embodiments, the bottom surface 1218 corresponds with a backside of the intermediate die 1206, and the through-holes 1222 are formed at the backside of the intermediate die 1206. In some embodiments the through-holes 1222 are formed at the surface of the pad 1220.

The bottom die 1204 likewise comprises two major opposing surfaces, labeled top surface 1224 and bottom surface 1226. The bottom die 1204 includes a set of posts 1228 disposed at the top surface 1224 in an arrangement corresponding to the arrangement of the through-holes 1214, 1222. While the posts 1228 are depicted in FIG. 12 as a set of metal pillars, in other embodiments the posts may be stud bumps as discussed above with reference to FIGS. 8-11. The set of posts 1228 extend from the bottom die 1204 in a direction substantially perpendicular to the top surface 1224. The metal posts 1228 may be composed of one or a combination of metals, such as copper (Cu), aluminum (Al), gold (Au), silver (Ag), platinum (Pt), nickel (Ni), or an alloy thereof. The metal posts 1228 and the through-holes 1214, 1222 are dimensioned such that the metal posts 1228 can be inserted into the through-holes 1214, 1222 when the top die 1202, intermediate die 1206 and bottom die 1204 are aligned and stacked to form the 3D device package 1200, as described below. Some or all of the through-holes 1214, 1222 can then be filled with solder or other material to bond the metal posts 1228 to the top and intermediate dice 1202, 1206, mechanically and electrically coupling the three dice 1202, 1204, 1206.

For ease of illustration, the sizes of the pads 1212, 1220, through-holes 1214, 1222, and metal posts 1228 are exaggerated relative to the dice 1202, 1204, 1206. Moreover, although FIG. 12 depicts sixteen pads 1212, 1220 in a uniform 4×4 grid arrangement on each of dice 1202, 1206 (as well as sixteen through-holes 1214, 1222 on dice 1202, 1206 and sixteen metal posts 1228 on die 1204 in corresponding 4×4 grid arrangements), in typical implementations the numbers of pads 1212, 1220, through-holes 1214, 1222 (or access holes), and metal posts 1228 typically are much greater than the sets of sixteen of each as shown, and these components may be compatibly arranged in arrangements other than a grid (e.g., an approximate ring, perimeter, checkerboard pattern, etc.).

Although depicted in an exploded view in FIG. 12, during fabrication of the 3D device package 1200, the top die 1202, intermediate die 1206, and bottom die 1204 are bonded together with the bottom surface 1218 of the intermediate die 1206 facing the top surface 1224 of the bottom die 1204, and the bottom surface 1210 of the top die 1202 facing the top surface 1216 of the intermediate die 1206 (and consequently the top surface 1224 of the bottom die 1204). The corresponding arrangements of the set of metal posts 1228, the set of access holes 1214, 1222, and the set of pads 1212, 1220 result in the insertion of each metal post 1228 into a corresponding through-hole 1222 of the intermediate die 1206, and a corresponding hole 1214 of the top die 1202 during the die bonding process. Moreover, the height of the metal posts 1228 is such that the metal posts 1228 reach through both the through-holes 1214, 1222 of both the top and intermediate dice 1202, 1204. Further, in the case of the top die 1202 comprising access holes 1214, the height of the metal posts 1228 is such that the metal posts 1228 extend through through-holes 1222 of the intermediate die 1206 and the access holes 1214 of the top die 1202 and are brought into contact with the pad 1212 overlying the corresponding access hole 1214 during the die stacking process. The metal posts 1228 may be tipped with solder material or solder material may be added to the through-holes 1214, 1222 so that after the dice 1202, 1204, 1206 are stacked, a solder reflow process may be performed to form a solder joint between the metal posts 1228 and the pads 1212, 1220, (or other metal layer of the dice 1202, 1206) thus forming a mechanical and electrical bond between the metal posts 1228 and the top and intermediate dice 1202, 1206.

In at least one embodiment, the solder reflow process for the intermediate die 1206 comprises performing a flux of the metal posts 1228 and the pads 1220 using a flux nozzle sprayer or a solder encapsulated metal wire (e.g., Cu, Au) before applying solder to each metal post 1228 and pad 1220 jointly. The solder may be applied to each metal post 1228 and pad 1220 jointly using solder nozzle jets, laser solder techniques, localized selective electroplating of the pads 1220 and posts 1228, solder deposits on the pads 1220 (before through-hole 1222 definition, then heat the stack and push the metal posts 1228 through the through-holes 1222), solder-encapsulated wire (with the outer diameter of the wire larger than the through-hole 1222 diameter), or conductive ink (e.g., conductive ink that flows better than solder and adheres to dielectrics). In at least one embodiment, the solder reflow process for the top die 1202 comprises recessing the metal post 1228 below a top surface of the pad 1212 and using solder paste or deposition/patterning, followed by solder reflow. With electrical pathways formed between the top die 1202, intermediate die 1206 and bottom die 1204 via the pads 1212, 1220 (or other metal layers) and the metal posts 1228, some or all of the pads 1212, 1220 (or other metal layers) and the metal posts 1228 may be used to conduct signaling or power between the dice 1202, 1204, 1206. In such instances, the pads 1212, 1220 are connected to the metal interconnect structure formed in the metal layers of the dice 1202, 1206 and the metal posts 1228 are connected to the metal interconnect structure formed in the metal layers of the die 1204. Power and signaling therefore may be conducted between the top die 1202, intermediate die 1206, and bottom die 1204 via these metal interconnect structures, the metal posts 1228, and the pads 1212, 1220. Moreover, in some instances, some or all of the metal post-pad junctions may be electrically inactive, that is, not used for conducting signaling or power between the dice 1202, 1204 1206, and instead used solely for bolstering the mechanical bonding between the dice 1202, 1204, 1206 or otherwise bolstering the structural integrity of the resulting 3D device package 1200. In such instances, one or both of the metal post 1228 and the pad 1212, 1220 of an electrically-inactive pillar-pad junction may be electrically isolated from the other metal interconnects of the corresponding die. Other implementations and techniques for through-hole post bonding are discussed below with reference to FIGS. 13-18.

Figure 13:
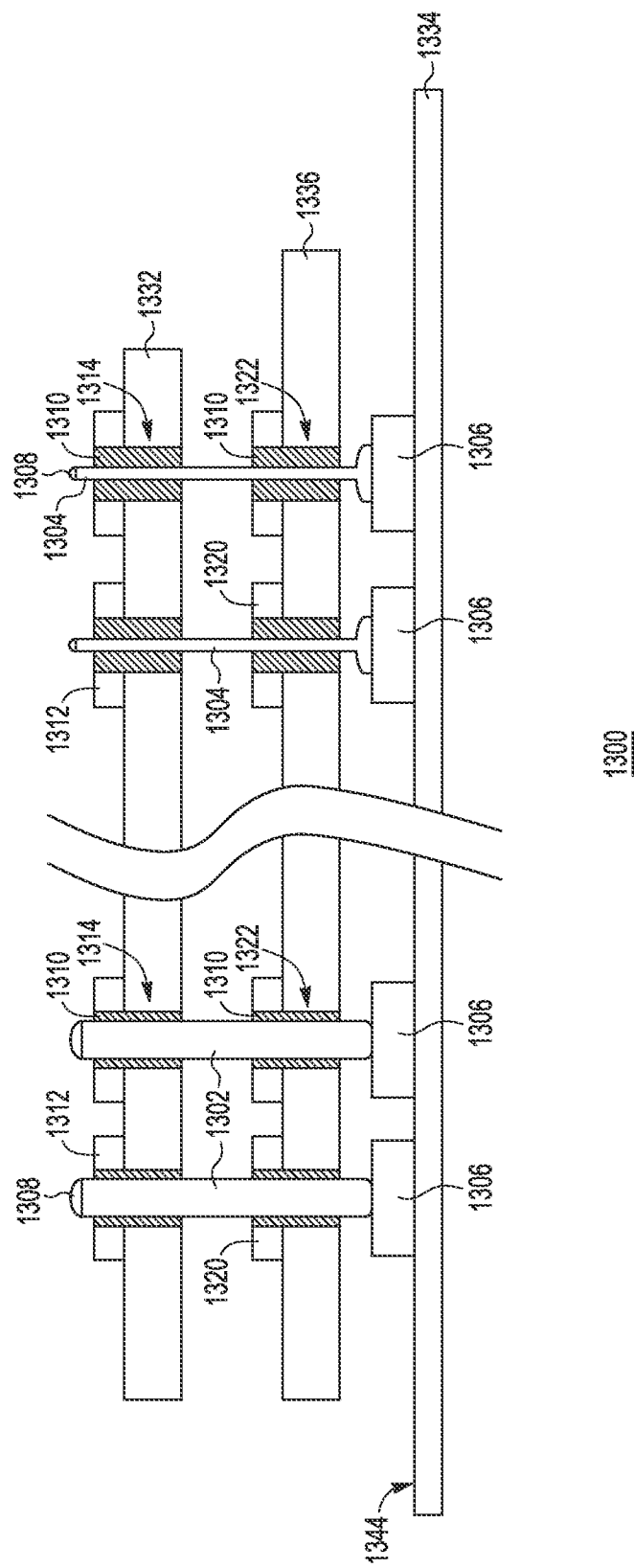
FIG. 13 is a cross-section view of an example 3D package having three dice stacked and bonded using through-hole post bonding techniques in accordance with some embodiments.

FIG. 13 illustrates a cross-section view of a 3D package 1300 having two or more dice, such as dice 1332, 1334, 1336, stacked and bonded using through-hole post bonding techniques in accordance with some embodiments. The 3D package 1300 represents a particular implementation of the 3D package 1200 of FIG. 12, whereby the top die 1332, bottom die 1334, and intermediate die 1336 (corresponding to the dice 1202, 1204, and 1206, respectively, of FIG. 12) are stacked to align monolithic metal posts 1302, 1304 disposed at the top surface 1344 of the bottom die 1334 with through-holes 1314, 1322 of the top and intermediate dice 1332, 1336. The monolithic metal posts 1302, 1304 extend through the through-holes 1314, 1322 to mechanically and electrically couple all three dice 1332, 1334, 1336. In the illustrated embodiment, both monolithic metal pillars 1302 and monolithic stud bumps 1304 are depicted as two separate implementations of the metal posts used to couple the dice 1332-1336 (with the "left" side depicting the monolithic metal pillars 1302 and the "right" side depicting the monolithic stud bumps 1304). Each of monolithic stud bumps 1304 and metal pillars 1302 may be used alone or in combination in various embodiments, such that some embodiments may comprise only monolithic stud bumps 1304, only metal pillars 1302, or a combination of monolithic stud bumps 1304 and metal pillars 1302. The use of metal pillars 1302 or stud bumps 1304 allows the walls of the through-holes 1314, 1322 to be substantially straight, reducing the footprint necessary to provide the electrical and mechanical connections between the dice 1332-1336 compared to through-silicon via and conventional pillar-to-pillar techniques. Further, stud bumps 1304 can be created with significant heights without plating thickness limitations. The metal pillars 1302 may be formed at bases 1306 or otherwise at the top surface 1344 of the bottom die 1334 according to the methods described above with reference to FIGS. 1-7, and the stud bumps 1304 may be formed at bases 1306 or otherwise at the top surface 1344 of the bottom die 1334 according to the methods described above with reference to FIGS. 8-11.

The illustrated through-hole post bonding technique allows for 3D device packages consisting of many dice using the same set of metal pillars 1302 or stud bumps 1304 to provide inter-die connectivity. For example, while the illustrated embodiment depicts two dice 1332, 1336 stacked on the metal posts 1302, 1304 of the bottom die 1334, other embodiments may stack more than two dice on the same metal posts 1302, 1304 to create a 3D device package of four or more dice.

Further, the distal end of the metal posts 1302, 1304 may comprise a solder deposit 1308, such that the distal end of the metal posts 1302, 1304 may be coupled to a pad of a fourth die via an access hole, rather than extending through the pad via a through-hole, or solder may be deposited in the access hole of the fourth die such that when the dice are stacked a solder reflow will bond the distal end of the metal posts 1302, 1304 to the corresponding pad. The metal posts 1302, 1304 may be dimensioned to extend beyond the pad 1312 of the top die 1332, remain below the top surface of the pad 1312, or be even with the pad 1312, as necessary. In some embodiments, once the 3D package 1300 is stacked, the dice 1332, 1334, 1336 may be bonded by filling the through-holes 1314, 1322 with solder 1310 to electrically couple the posts 1302, 1304 to the pads 1312, 1320, metal layers of the dice 1332, 1336, or a combination of these.

In at least one embodiment, the solder 1310 is deposited into the through-holes 1314, 1322 of one dice at a time. For example, in the illustrated embodiment, the intermediate die 1336 may be stacked on the bottom die 1334, and solder 1310 may be added to the through-holes 1322 of the intermediate die 1336 before the top die 1332 is added to the stack. Further, in some embodiments stacking additional dice, any number of dice may be stacked and bonded before any number of remaining dice. For example, two dice may be stacked and bonded, followed by one die stacked and bonded, followed by three dice stacked and bonded, etc. Further, standoffs or underfill may be used between dice as needed.

Figure 14:
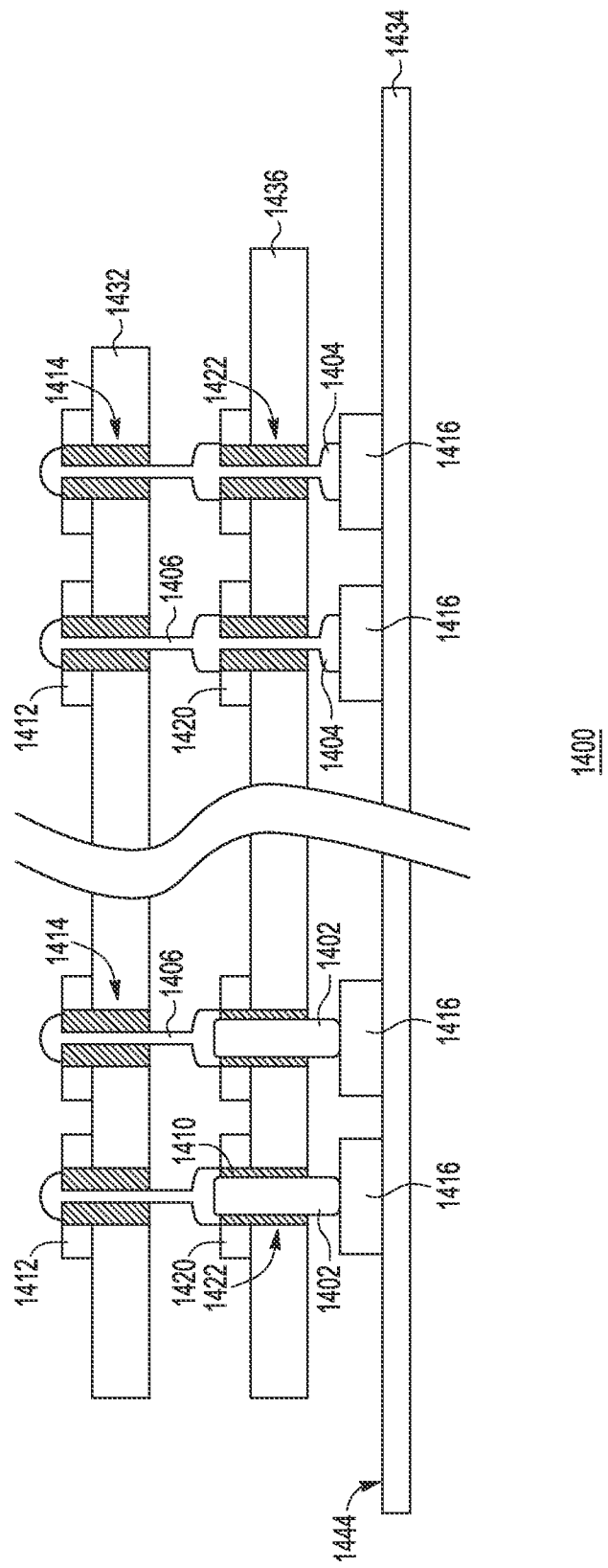
FIG. 14 is a cross-section view of another example 3D package having three dice stacked and bonded using through-hole post bonding techniques in accordance with some embodiments

FIG. 14 illustrates a cross-section view of a 3D package 1400 having two or more dice, such as dice 1432, 1434, 1436 (corresponding to the dice 1202, 1204, and 1206, respectively, of FIG. 12), stacked and bonded using through-hole post bonding techniques in accordance with some embodiments. As illustrated, the 3D package 1400 is depicted with two different implementations, with the "right" side depicting stud bumps 1404, 1406 and the "left" side depicting a combination of metal pillars 1402 and stud bumps 1406.

In each implementation, a first set of metal posts including metal pillars 1402 or stud bumps 1404 are disposed at bases 1416 or the top surface 1444 of the bottom die. For example, in some embodiments, bases 1416 comprise bond pads. The bottom die 1434 and the intermediate die 1436 are stacked such that the first set of metal posts 1402, 1404 extend through the intermediate die 1436 and pads 1420 via through-holes 1422. In at least one embodiment, solder 1410 is then added to the through-holes 1422 to electrically couple the first set of metal posts 1402, 1404 to the pads 1420, metal layers of the intermediate die 1436, or to both the pads 1420 and metal layers of the intermediate die 1436.

A second set of metal posts 1406 (comprising stud bumps or metal pillars) is disposed at the distal end of the first set of metal posts 1402, 1404 (or solder 1410 deposited at the distal end of the first set of metal posts 1402, 1404). The top die 1432 is then stacked on the workpiece representing the bottom die 1434 and the intermediate die 1436, such that the second set of metal posts 1406 traverse the thickness of the top die 1432 and pads 1412 via through-holes 1414. The second set of metal posts 1406 are then bonded to the top die 1432 using solder or other bonding material. For example, in the illustrated embodiment, the stud bumps 1404, 1406 electrically couple themselves to the metal pads 1412, 1420 (e.g., by terminating in a wire ball or otherwise). In at least one embodiment, stud bumps 1404, 1406 are implemented with the addition of solder 410, such that the solder 410 electrically couples the stud bumps 1404, 1406 to the pads 1412, 1420 or metal layers within the dice 1432, 1436. The illustrated through-hole post bonding technique reduces the likelihood of solder and environmental exposure.

Figure 15:
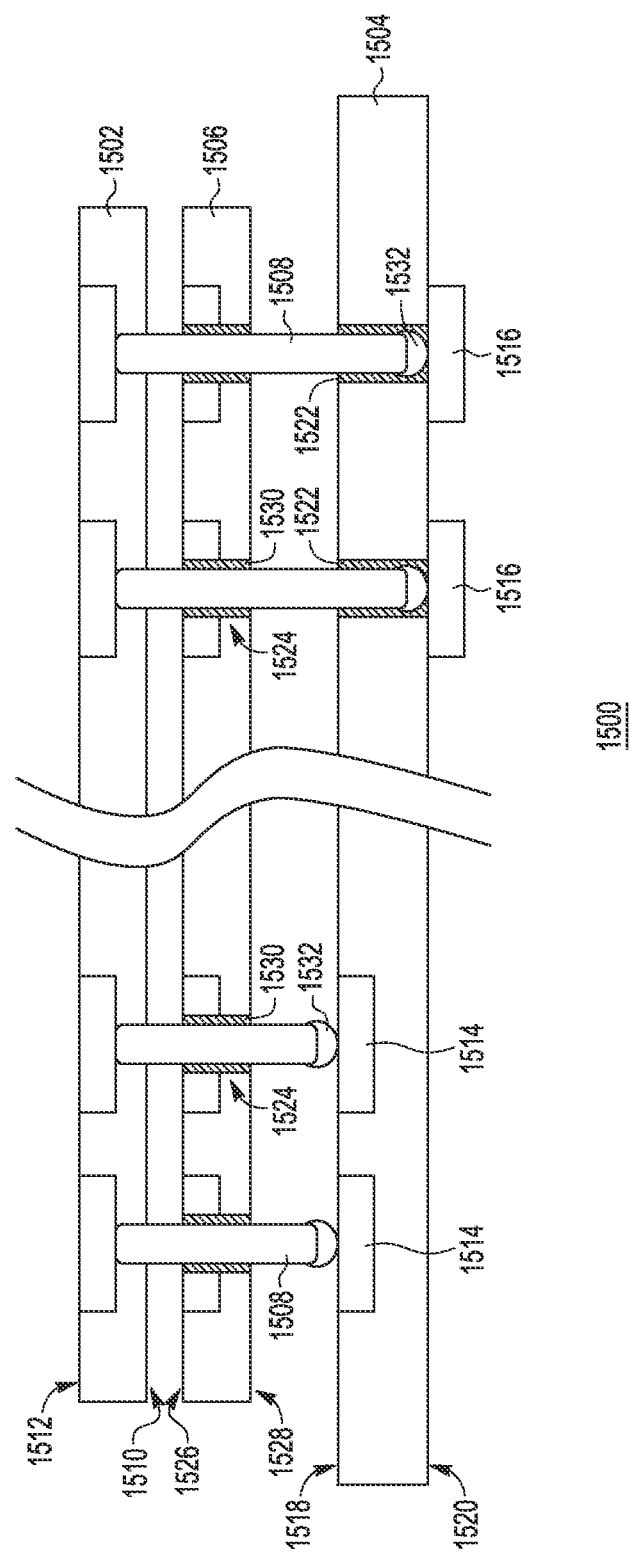
FIG. 15 is a cross-section view of another example 3D package having three dice stacked and bonded using through-hole pillar bonding techniques in accordance with some embodiments

For ease of illustration, the second set of metal posts 1406 are depicted as stud bumps, however other embodiments may use metal pillars. Further, any combination of first set of metal posts 1402, 1404 and second set of metal posts 1406 may be used. In some embodiments, more than three dice 1432, 1434, 1436 are stacked using these and other techniques FIG. 15 is a cross-section view of a 3D package 1500 having a top die 1502, a bottom die 1504 and an intermediate die 1506 stacked and bonded using through-hole pillar bonding techniques in accordance with some embodiments. A set of metal posts 1508 (depicted as metal pillars) are formed within the top die 1502 to extend beyond a bottom surface 1510 of the top die 1502. For example, in at least one embodiment, the posts are formed as straight-walled through-silicon vias (TSVs) within a wafer. A resist is patterned at the straight-walled TSV (e.g., using lithography), then a deep etch is performed with a stop on metal (e.g., a metal pad) before the resist is removed. Once the resist is removed, a dielectric layer is deposited (e.g., silicon dioxide, or silicon nitride), then an isotropic etch through the straight-walled TSVs exposes the metal while leaving the sidewall dielectric. A blanket metal deposition (e.g., copper seed deposition) is followed by thick resist patterning with holes over the deep etched holes. Finally, the resulting metal posts 1508 are plated, and the resist is removed. In at least one embodiment, a thick oxide deposited at the top surface 1512 of the top die 1502 provides dimensional stability, prevents warping, and insulates the plating from the substrate.

The metal posts 1508 are dimensioned so as to stack the desired amount of dice such that a distal end of each post can be electrically coupled to the bottom die 1504. In at least one embodiment, the metal pillar 1508 is dimensioned so as to be electrically coupled to a pad 1514 at a top surface 1518 of the bottom die 1504. In another embodiment, the metal pillar is dimensioned so as to be electrically coupled to a pad 1516 at a bottom surface 1520 or metal layer of the bottom die 1504 via an access hole 1522. The metal posts 1508 may be etched or otherwise dimensioned to reach a desired diameter. Further, the distal end (or contact surface) of the metal posts 1508 may be etched to form a convex contact surface, which may or may not correspond to a concave surface of the access hole 1522 or the pads 1514, 1516.

The top die 1502 is stacked with the intermediate die 1506, such that the metal posts 1508 align with and traverse through-holes 1524 of the intermediate die 1506 from a top surface 1526 of the intermediate die 1506 beyond a bottom surface 1528 of the intermediate die 1506. In at least one embodiment, the top die 1502 and intermediate die 1506 are bonded before stacking the bottom die 1504. For example, in some embodiments solder 1530 is deposited in the through-holes 1524 to mechanically and electrically couple the metal posts 1508 to the intermediate die 1506. In some embodiments, a solder deposit 1532 is formed at the distal end of each metal pillar 1508 or within each access hole 1522, such that when the bottom die 1504 is stacked with the 3D package consisting of the top and intermediate dice 1502, 1506, a solder reflow may be used to electrically couple the bottom die 1504 to the metal posts 1508 to create 3D package 1500. In another embodiment, solder is deposited on all or substantially all of the exposed surfaces of the metal posts 1508 prior to stacking, such that a solder reflow can be performed to bond the metal posts 1508 to the intermediate die 1506 or the bottom die 1504. While only one intermediate die 1506 is shown in the illustrated embodiments, other embodiments may include additional intermediate dice. Further, metal posts or other bonding mechanisms may be used to stack additional dice at the top surface 1512 of the top die 1502, or the bottom surface 1520 of the bottom die 1504.

Figure 16:
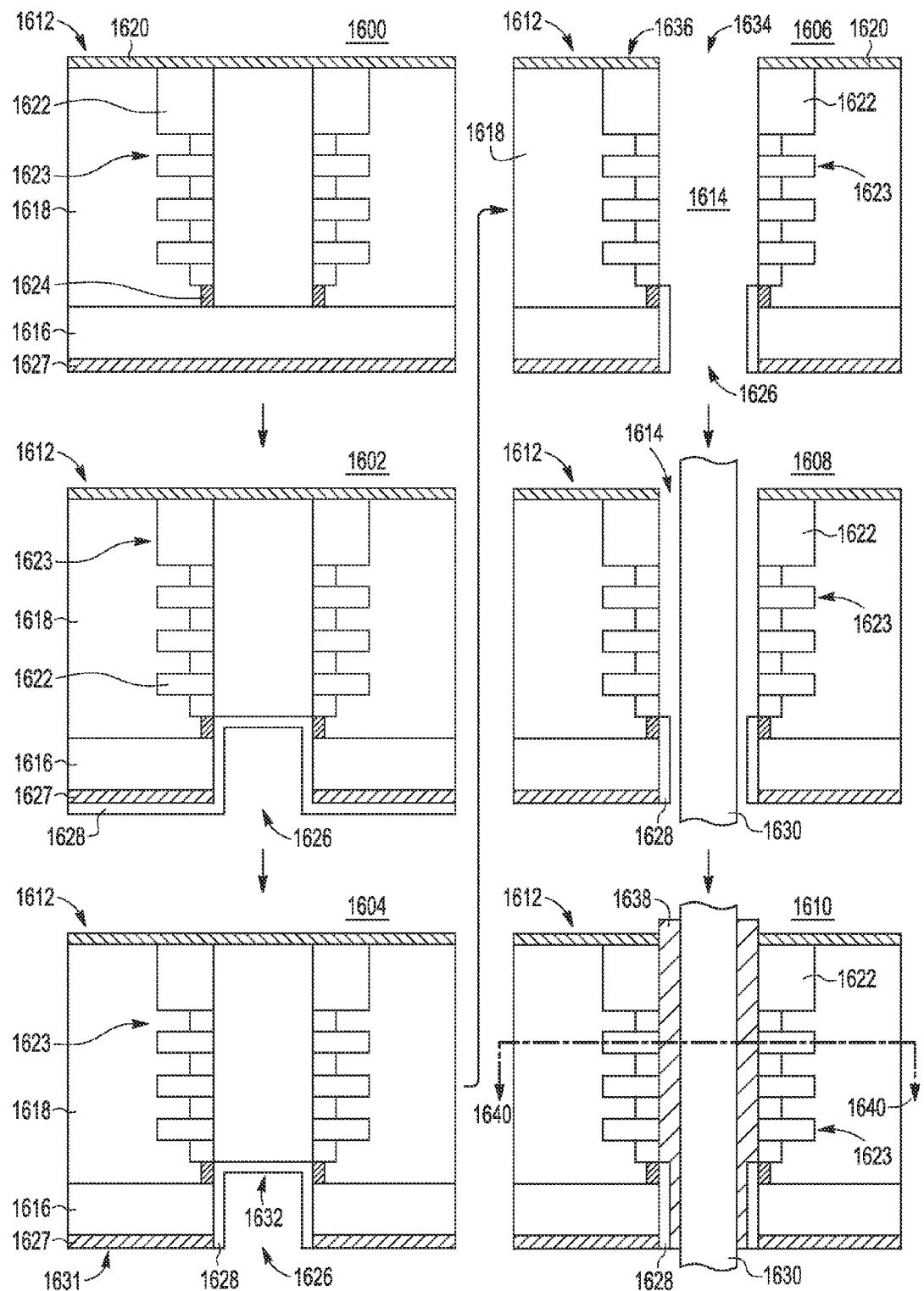
FIG. 16 is a flow diagram illustrating an example process for forming through-holes in a die in accordance with some embodiments.

FIG. 16 illustrates a series of cross-section views 1600, 1602, 1604, 1606, 1608, and 1610 (collectively "1600-1610") depicting an example technique for forming through-holes 1614 in a workpiece 1612 in accordance with some embodiments. The workpiece 1612 can represent any die of a through-hole post 3D package fabricated in accordance with the techniques described herein, such as the 3D packages 1200, 1300, 1400, or 1500 of FIGS. 12-15, respectively. Cross-section views 1600-1610 illustrate the process of forming a single through-hole 1614, and this process may be performed for each through-hole 1614 to be formed at the workpiece 1612.

As illustrated by cross-section view 1600, the workpiece 1612 is shown after the front-end-of-line (FEOL) and back-end-of-line (BEOL) process have completed, such that the workpiece 1612 comprises a wafer 1616, overlain with inter-layer dielectric (ILD) 1618 and metal layers 1622, which in turn are overlain with a layer of dielectric barrier 1620, and a bottom layer of dielectric 1627 at a bottom surface of the wafer 1616. In at least one embodiment, the bottom layer of dielectric 1627 prevents the bottom of the wafer from shorting out. In at least one embodiment, each of the metal layers 1622 is formed as an annular ring so as to form an annular ring structure 1623 within the ILD 1618 (the "ring" shape of the annular ring structure 1623 is more clearly depicted in the top view cross-section of FIG. 18). In at least one embodiment, each of the metal layers 1622 of the annular ring structure 1623 is connected to an adjacent metal layer by vias in an annular ring arrangement rather than discrete vias. The annular ring structure 1623 represents the boundary for formation of a corresponding through-hole 1614. In at least one embodiment, a contact layer 1624 also forms the annular ring structure 1623. For example, in some embodiments the contact layer 1624 comprises vias, such as vias of tungsten.

In cross-section view 1602, a hole 1626 is formed in the wafer 1616 using, for example, an etching process. A dielectric barrier 1628 is deposited over the wafer 1616 and the bottom layer of dielectric 1627, coating the walls of the hole 1626, and ILD 1618 exposed by the hole 1626.

In cross-section view 1604, the dielectric barrier 1628 is selectively removed (e.g., by anisotropic etching), such that the dielectric barrier only serves as a barrier for desired components of the workpiece 1612. The dielectric barrier 1628 is used to prevent electrical coupling of the metal post 1630 to the components protected by the dielectric barrier 1628 (e.g., to prevent shorting of the wafer 1616). In at least one embodiment, the hole 1626 does not extend into the annular ring structure 1623 formed by the metal layers 1622, to prevent the formation of a dielectric barrier over the ring structure 1623. In another embodiment, the dielectric barrier 1628 is deposited over one or more metal layers 1622 to prevent electrical coupling of the one or more metal layers 1622 to the metal post 1630. In the depicted embodiment, the dielectric barrier 1628 has been removed from a bottom surface 1631 of the bottom layer of dielectric 1627 and a base 1632 of the hole 1626, such that the dielectric barrier 1628 remains on the inner walls of the hole 1626.

In cross-section view 1606, a hole 1634 is formed (e.g., by etching) at a top surface 1636 of the workpiece 1612, through the dielectric barrier 1620 and the ILD 1618 until hole 1634 meets hole 1626, forming through-hole 1614. In at least one embodiment, the hole 1634 is also formed through a metal pad (not shown) disposed at the top surface 1636 of the workpiece 1612. In other embodiments, the metal pad is formed with a hole to correspond to hole 1634 before it is disposed at the top surface 1636 of the workpiece 1612. When forming hole 1634, the material of the ILD 1618 within the annular ring structure 1623 is removed, such that the metal layers 1622 are exposed within through-hole 1614.

In cross-section view 1608, a metal post 1630 is inserted into the through-hole 1614 (i.e., the dice are stacked). The metal post 1630 may comprise a metal pillar, a stud bump, or the like, and may comprise different dimensions in different embodiments. In at least one embodiment, the metal post 1630 is dimensioned so as to come into contact with the metal layers 1622 or the dielectric barrier 1628 for alignment purposes.

Finally, in cross-section view 1610, solder 1638 or other electrically conductive bonding material is deposited in the through-hole 1614 to couple the metal post 1630 to the workpiece, such that the metal layers 1622 exposed to the through-hole 1614 are electrically coupled to the metal post 1630, while components protected by the dielectric barrier are not electrically coupled to the metal post 1630. The annular ring structure 1623 provides mechanical stability in addition to an electrical connection to the metal post 1630. Cross-section view 1610 is depicted with cutline 1640-1640, the cross-section of which is described in detail below with reference to FIG. 18.

Figure 17:
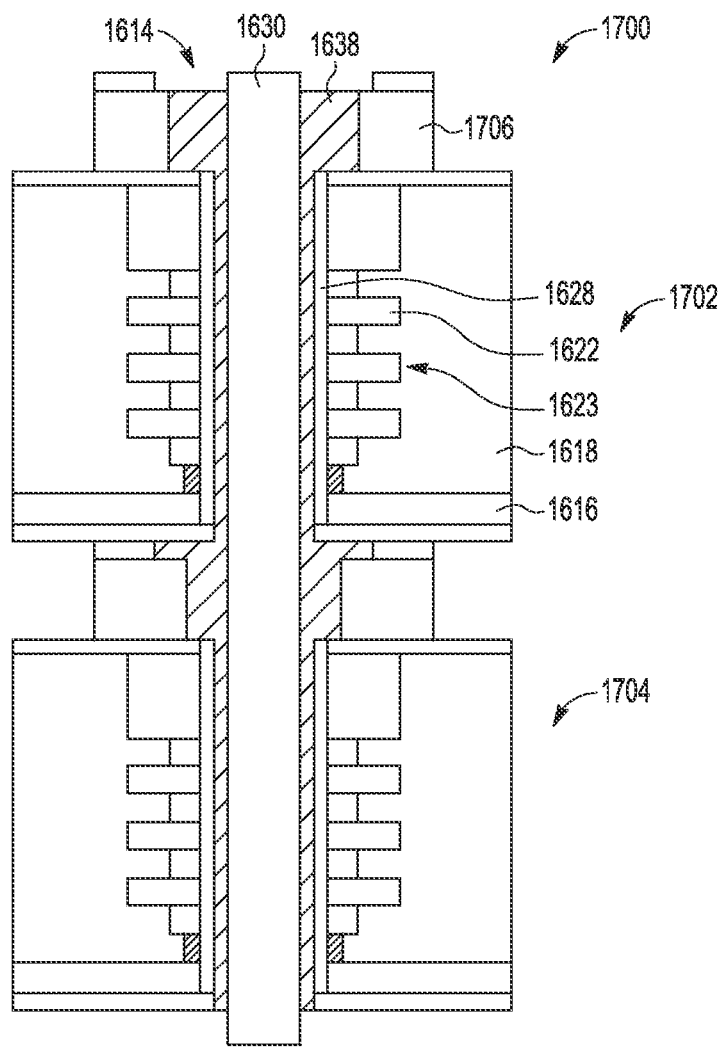
FIG. 17 is a cross-section view of an example through-hole with a metal post in accordance with some embodiments.
Figure 18:
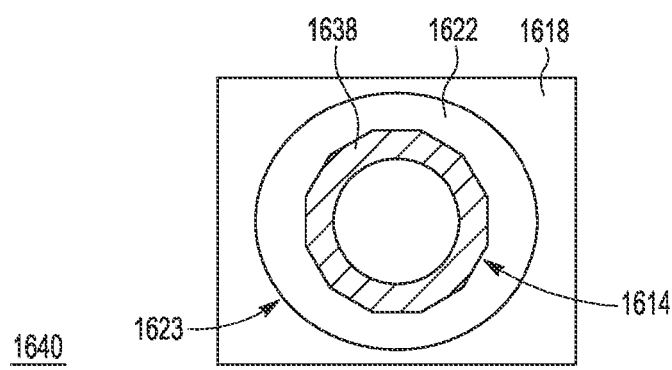
FIG. 18 is a cross-section view of another example through-hole with a metal post in accordance with some embodiments.

FIGS. 17 and 18 illustrate cross-section views illustrating example through-hole post bonding techniques in accordance with some embodiments. As illustrated in FIG. 17, a 3D device package 1700 comprises two stacked dice 1702, 1704. In at least one embodiment, the two stacked dice 1702, 1704 are intermediate dice of a 3D device package of at least four dice. Each die 1702 comprises the wafer 1616 overlain with inter-layer dielectric (ILD) 1618 and metal layers 1622. A pad 1706 is disposed at a top surface of the die 1702, and may be composed of any of a variety of conductive materials or combinations thereof, such as aluminum, copper, gold, silver, tungsten, nickel, and the like. In at least one embodiment, the metal layers 1622 are formed as annular rings within the ILD 1618 and together forming an annular ring structure 1623 (the "ring" shape of the annular ring structure 1623 is more clearly depicted in the top view cross-section of FIG. 18), and the pad 1706 comprises a hole to align with the annular ring structure 1623. Similar to the workpiece 1612 of FIG. 16, the annular ring structure 1623 of metal layers 1622 provides mechanical stability to the device package 1700, however in the illustrated embodiment, the annular ring structure 1623 of metal layers 1622 is prevented from providing an electrical connection due to the dielectric barrier 1628.

While in the process discussed above with reference to FIG. 16, the hole 1626 formed through the wafer 1616 does not extend into the annular ring structure 1623 formed by the metal layers 1622, in some embodiments the hole 1626 extends into the annular ring structure 1623 formed by the metal layers 1622. As a result, the dielectric barrier 1628 deposited on the walls of the hole 1626 would cover the metal layers 1622 exposed by the hole 1626, as depicted in the example embodiment of FIG. 17. As illustrated, the dice 1702, 1704 are stacked such that the metal post 1630 traverses the corresponding through holes 1630. Solder 1638 is deposited into the through-hole 1614 electrically coupling the metal post 1630 to the pads 1706, without electrically coupling the metal post 1630 to the metal layers 1622 protected by the dielectric barrier 1628. In at least one embodiment, the dielectric barrier 1628 may be selectively removed (e.g., by anisotropic etching) to expose specific metal layers 1622 to an electrical connection with the metal post 1630, while isolating other metal layers 1622 with the dielectric barrier 1628. Alternatively, in at least one embodiment, the metal posts 1630 comprise stud bumps made from insulated wire, such that the dielectric barrier 1628 is not necessary. That is, the through-hole 1614 may be formed in a single formation (without forming two separate holes 1626, 1634) since the insulated wire will take the place of the dielectric barrier 1628 in preventing electrical connections between components and the stud bump 1630. In such a case, the insulation of the wire may be selectively stripped (e.g., by laser stripping) above the pads 1706, and solder may be applied to create a solder joint between the stripped wire and the pad 1706.

FIG. 18 illustrates a cross-section view along cutline 1640-1640 of FIG. 16 in accordance with some embodiments. The face of the through-hole 1614 visible in the cross-section comprises a polygon, such that the through-hole 1614 itself resembles a prism. In the illustrated embodiment, the flat edges of the through-hole 1614 allow the solder to flow through multiple intermediate dice in a single application, preventing the need for individual dice to be soldered on a per-die basis. The polygon face of the hole may comprise any number of sides; for example, in one embodiment the polygon face of the through-holes 1614 comprise between six and twenty-four sides. Alternatively, in some embodiments, the face of the metal post 1630 comprises a polygon, or the metal post 1630 otherwise forms a prism, while the through-hole 1614 maintains a substantially cylindrical form. In another embodiment, the through-hole 1614 is formed as a keyhole, such that individual pockets are created to allow solder to flow freely between the metal post 1614 and the walls of the through-hole 1614. In some embodiments, each through-hole 1614 comprises at least one substantially flat wall that provides a gap between the through-hole 1614 and the corresponding metal post 1630 extending through the through-hole 1614. The term "substantially" is defined as largely but not necessarily wholly that which is specified. The term generally is defined as at least close to or approaching a given value or state (preferably within 10% of, more preferably within 1% of, and most preferably within 0.1% of) and includes what is specified (e.g., substantially perpendicular includes perpendicular and substantially parallel includes parallel), as understood by a person of ordinary skill in the art. The gaps and pockets created by the discussed through-hole 1614 formations allow solder to flow through multiple dice in a single pass, preventing the need for individual dice to be soldered on a per-die basis.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A device package comprising:
    a first semiconductor die comprising:
        a first set of through-holes in a first arrangement, each through-hole of the first set of through-holes extending between a first surface of the first semiconductor die and a second surface of the first semiconductor die; and
    a second semiconductor die comprising:
        a first set of metal posts disposed at a third surface of the second semiconductor die in a second arrangement corresponding to the first arrangement, the third surface facing the second surface, and each metal post of the first set of metal posts extending through a corresponding through-hole of the first set of through-holes to a point beyond the first surface of the first semiconductor die.

2. The device package of claim 1, wherein the metal posts of the first set of metal posts comprise at least one of pillars and stud bumps.

3. The device package of claim 1, wherein
    the second semiconductor die further comprises a set of pads at the third surface; and
    the through-holes of the first set of through-holes further extend through the set of pads.

4. The device package of claim 1, further comprising:
    a third semiconductor die comprising:
        a fourth surface; and
        a set of holes, such that the fourth surface faces the third surface of the second semiconductor die and the first surface of the first semiconductor die, and such that each metal post of a second set of metal posts of the third semiconductor die extends into the set of holes of the third semiconductor die.

5. The device package of claim 4, wherein the metal posts of the second set of metal posts comprise at least one of pillars and stud bumps.

6. The device package of claim 1, further comprising:
    a third semiconductor die comprising:
        a fourth surface; and
        a set of holes, such that the fourth surface faces the third surface of the second semiconductor die and the first surface of the first semiconductor die and the first set of metal posts extend through the set of holes.

7. The device package of claim 6, wherein the metal posts of the first set of metal posts comprise at least one of pillars and stud bumps.

8. The device package of claim 6, wherein:
    the set of holes comprises a set of access holes extending from the fourth surface of the third semiconductor die to a set of pads at a metal layer of the third semiconductor die; and
    each metal post of the first set of metal posts is electrically coupled to a corresponding pad of the set of pads.

9. The device package of claim 6, wherein the set of holes comprises a second set of through-holes extending through the third semiconductor die.

10. A method comprising:
    stacking a first semiconductor die and a second semiconductor die, such that a first surface of the first semiconductor die faces a second surface of the second semiconductor die and such that each metal post of a first set of metal posts of the first semiconductor die extends from the first surface of the first semiconductor die beyond a third surface of the second semiconductor die opposite the second surface via a corresponding through-hole of a first set of through-holes of the second semiconductor die; and bonding the first semiconductor die and the second semiconductor die such that the metal posts of the first set of metal posts are electrically coupled to the second semiconductor die.

11. The method of claim 10, wherein the metal posts of the first set of metal posts comprise at least one of pillars and stud bumps.

12. The method of claim 10, wherein the through-holes of the first set of through-holes further extend through a set of pads at the third surface of the second semiconductor die.

13. The method of claim 10, further comprising:

stacking a third semiconductor die comprising a fourth surface and a set of holes, such that the fourth surface faces the third surface of the second semiconductor die and the first surface of the first semiconductor die, and such that each metal post of a second set of metal posts of the third semiconductor die extends into the set of holes of the third semiconductor die; and bonding the second semiconductor die and the third semiconductor die such that the metal posts of the second set of metal posts are electrically coupled to the third semiconductor die.

14. The method of claim 10, further comprising:

stacking a third semiconductor die comprising a fourth surface and a set of holes, such that the fourth surface faces the third surface of the second semiconductor die and the first surface of the first semiconductor die and the first set of metal posts extend through the set of holes; and bonding the first semiconductor die and the third semiconductor die such that the metal posts of the first set of metal posts are electrically coupled to the third semiconductor die.

15. The method of claim 14, wherein:

the set of holes comprises a set of access holes extending from the fourth surface of the third semiconductor die to a set of pads at a metal layer of the third semiconductor die; and each metal post of the first set of metal posts is electrically coupled to a corresponding pad of the set of pads.

16. The method of claim 14, wherein the set of holes comprises a second set of through-holes extending through the third semiconductor die.

17. A method comprising:

forming a set of through-holes in a first arrangement at a first semiconductor die, each through-hole of the set of through-holes extending through the first semiconductor die from a first surface of the first semiconductor die to a second surface of the first semiconductor die; and bonding the first semiconductor die and a second semiconductor die, the second semiconductor die comprising a set of metal posts disposed at a surface of the second semiconductor die in a second arrangement corresponding to the first arrangement, the set of metal posts extending through the first semiconductor die beyond the second surface via the set of through-holes.

18. The method of claim 17, wherein each through-hole of the set of through-holes comprises at least one substantially flat wall that provides a gap between the through-hole and the corresponding metal post extending through the through-hole.

19. The method of claim 17, further comprising:

forming a set of metal annular ring structures within the first semiconductor die, each annular ring structure forming a boundary of a corresponding through-hole of the set of through-holes.

20. The method of claim 17, further comprising:

forming a dielectric barrier in each through-hole of the set of through-holes between one or more layers of the first semiconductor die and the corresponding metal post of the set of metal posts.

* * * * *